United States Patent
Coyne

(10) Patent No.: US 10,181,719 B2
(45) Date of Patent: Jan. 15, 2019

(54) OVERVOLTAGE BLOCKING PROTECTION DEVICE

(71) Applicant: Analog Devices Global, Hamilton (BM)

(72) Inventor: Edward John Coyne, Galway (IE)

(73) Assignee: Analog Devices Global, Hamilton (BM)

( * ) Notice: Subject to any disclaimer, the term of this patent is extended or adjusted under 35 U.S.C. 154(b) by 434 days.

(21) Appl. No.: 14/658,779

(22) Filed: Mar. 16, 2015

(65) Prior Publication Data
US 2016/0276827 A1    Sep. 22, 2016

(51) Int. Cl.
*H02H 9/04* (2006.01)
*H01L 27/02* (2006.01)

(52) U.S. Cl.
CPC ........ *H02H 9/041* (2013.01); *H01L 27/0259* (2013.01); *H01L 27/0266* (2013.01); *H02H 9/046* (2013.01)

(58) Field of Classification Search
CPC .... H02H 9/041; H02H 9/046; H01L 27/0259; H01L 27/0266
USPC ......................................................... 361/56
See application file for complete search history.

(56) References Cited

U.S. PATENT DOCUMENTS

| | | | |
|---|---|---|---|
| 3,436,667 A | 4/1969 | Leonard Kedson | |
| 3,660,687 A | 5/1972 | Sahm et al. | |
| 3,694,670 A | 9/1972 | Marzolf | |
| 3,764,864 A | 10/1973 | Okumura et al. | |
| 4,260,910 A | 4/1981 | Colman | |
| 4,476,480 A | 10/1984 | Fuse | |
| 4,520,277 A | 5/1985 | Hahn | |
| 4,528,461 A | 7/1985 | Shackle et al. | |
| 4,633,283 A | 12/1986 | Avery | |
| 4,937,700 A * | 6/1990 | Iwahashi | H03G 11/002 257/368 |
| 4,992,844 A | 2/1991 | Yakushiji | |

(Continued)

FOREIGN PATENT DOCUMENTS

DE    10 2007 040 875 A1    3/2009
EP          0 168 678 A2    1/1986
(Continued)

OTHER PUBLICATIONS

International Search Report and Written Opinion of the International Searching Authority for International Application No. PCT/US2016/022364, dated Jul. 6, 2016, 13 pages.

(Continued)

*Primary Examiner* — Kevin J Comber
(74) *Attorney, Agent, or Firm* — Knobbe, Martens, Olson & Bear, LLP

(57) ABSTRACT

A protection device is provided that is placed in series connection between an input or signal node and a node to be protected. If the node to be protected is a relatively high impedance node, such as the gate of a MOSFET, then the protection device need not carry much current. This enables it to be built to be very fast. This enables it to respond rapidly to an overvoltage event so as to protect the circuit connected to the node to be protected. The protection device may be used in conjunction with other protection cells that offer greater current carrying capability and controllable trigger voltages, but which are intrinsically slower acting.

20 Claims, 15 Drawing Sheets

(56) References Cited

U.S. PATENT DOCUMENTS

| | | |
|---|---|---|
| 5,043,782 A | 8/1991 | Avery |
| 5,061,652 A | 10/1991 | Bendernagel et al. |
| 5,081,517 A | 1/1992 | Contiero et al. |
| 5,091,763 A | 2/1992 | Sanchez |
| 5,212,106 A | 5/1993 | Erb et al. |
| 5,212,618 A | 5/1993 | O'Neill et al. |
| 5,235,201 A | 8/1993 | Honna |
| 5,276,582 A | 1/1994 | Merrill et al. |
| 5,341,005 A | 8/1994 | Canclini |
| 5,343,053 A | 8/1994 | Avery |
| 5,371,401 A | 12/1994 | Kurita |
| 5,432,366 A | 7/1995 | Banerjee et al. |
| 5,436,486 A | 7/1995 | Fujishima et al. |
| 5,440,151 A | 8/1995 | Crevel et al. |
| 5,440,162 A | 8/1995 | Worley et al. |
| 5,473,169 A | 12/1995 | Ker et al. |
| 5,485,023 A | 1/1996 | Sumida |
| 5,541,801 A | 7/1996 | Lee et al. |
| 5,576,557 A | 11/1996 | Ker et al. |
| 5,576,574 A | 11/1996 | Hong |
| 5,594,266 A | 1/1997 | Beigel et al. |
| 5,602,409 A | 2/1997 | Olney |
| 5,610,425 A | 3/1997 | Quigley et al. |
| 5,615,074 A | 3/1997 | Avery |
| 5,637,892 A | 6/1997 | Leach |
| 5,637,901 A | 6/1997 | Beigel et al. |
| 5,652,689 A | 7/1997 | Yuan |
| 5,663,860 A | 9/1997 | Swonger |
| 5,668,024 A | 9/1997 | Tsai et al. |
| 5,719,432 A | 2/1998 | Kariyazono et al. |
| 5,736,769 A | 4/1998 | Nishiura et al. |
| 5,742,084 A | 4/1998 | Yu |
| 5,745,323 A | 4/1998 | English et al. |
| 5,757,045 A | 5/1998 | Tsai et al. |
| 5,781,389 A | 7/1998 | Fukuzako et al. |
| 5,786,617 A | 7/1998 | Merrill et al. |
| 5,818,088 A | 10/1998 | Ellis |
| 5,832,376 A | 11/1998 | Henderson et al. |
| 5,862,301 A | 1/1999 | Gontowski |
| 5,889,644 A | 3/1999 | Schoenfeld et al. |
| 5,892,264 A | 4/1999 | Davis et al. |
| 5,895,940 A | 4/1999 | Kim |
| 5,912,490 A | 6/1999 | Hebert et al. |
| 5,949,094 A | 9/1999 | Amerasekera |
| 5,973,341 A | 10/1999 | Letavic et al. |
| 5,998,813 A | 12/1999 | Bernier |
| 6,084,269 A | 7/2000 | Davies et al. |
| 6,097,068 A | 8/2000 | Brown et al. |
| 6,137,140 A | 10/2000 | Efland et al. |
| 6,144,542 A | 11/2000 | Ker et al. |
| 6,159,814 A | 12/2000 | Gardner et al. |
| 6,236,087 B1 | 5/2001 | Daly et al. |
| 6,248,652 B1 | 6/2001 | Kokubun |
| 6,258,634 B1 | 7/2001 | Wang et al. |
| 6,310,379 B1 | 10/2001 | Andresen et al. |
| 6,329,694 B1 | 12/2001 | Lee et al. |
| 6,365,475 B1 | 4/2002 | Cheng et al. |
| 6,403,992 B1 | 6/2002 | Wei |
| 6,404,261 B1 | 6/2002 | Grover et al. |
| 6,423,987 B1 | 7/2002 | Constapel et al. |
| 6,462,360 B1 | 10/2002 | Higgins, Jr. et al. |
| 6,501,632 B1 | 12/2002 | Avery et al. |
| 6,512,662 B1 | 1/2003 | Wang |
| 6,590,273 B2 | 7/2003 | Okawa et al. |
| 6,621,126 B2 | 9/2003 | Russ |
| 6,665,160 B2 | 12/2003 | Lin et al. |
| 6,667,870 B1 | 12/2003 | Segervall |
| 6,690,557 B2 | 2/2004 | Hung et al. |
| 6,704,180 B2 | 3/2004 | Tyler et al. |
| 6,707,118 B2 | 3/2004 | Muljono et al. |
| 6,713,816 B1 | 3/2004 | Wolf et al. |
| 6,724,603 B2 | 4/2004 | Miller et al. |
| 6,756,834 B1 | 6/2004 | Tong et al. |
| 6,765,771 B2 | 7/2004 | Ker et al. |
| 6,768,616 B2 | 7/2004 | Mergens et al. |
| 6,870,202 B2 | 3/2005 | Oka |
| 6,882,009 B2 | 4/2005 | Ker et al. |
| 6,927,957 B1 | 8/2005 | Bakulin et al. |
| 6,960,792 B1 | 11/2005 | Nguyen |
| 6,960,811 B2 | 11/2005 | Wu et al. |
| 6,979,869 B2 | 12/2005 | Chen et al. |
| 7,034,363 B2 | 4/2006 | Chen |
| 7,038,280 B2 | 5/2006 | Righter |
| 7,071,528 B2 | 7/2006 | Ker et al. |
| 7,125,760 B1 | 10/2006 | Reese et al. |
| 7,232,705 B2 | 6/2007 | Righter |
| 7,232,711 B2 | 6/2007 | Gambino et al. |
| 7,335,543 B2 | 2/2008 | Chen et al. |
| 7,345,341 B2 | 3/2008 | Lin et al. |
| 7,385,793 B1 | 6/2008 | Ansel et al. |
| 7,436,640 B2 | 10/2008 | Su et al. |
| 7,471,493 B1 | 12/2008 | Huang et al. |
| 7,479,672 B2 | 1/2009 | Zhao |
| 7,538,998 B2 | 5/2009 | Tsai et al. |
| 7,566,914 B2 | 7/2009 | Salcedo et al. |
| 7,570,467 B2 | 8/2009 | Watanabe et al. |
| 7,601,991 B2 | 10/2009 | Salcedo et al. |
| 7,663,190 B2 | 2/2010 | Vinson |
| 7,714,357 B2 | 5/2010 | Hayashi et al. |
| 7,834,378 B2 | 11/2010 | Ryu et al. |
| 7,859,082 B2 | 12/2010 | Stecher |
| 7,910,999 B2 | 3/2011 | Lee et al. |
| 7,969,006 B2 | 6/2011 | Lin et al. |
| 8,044,457 B2 | 10/2011 | Salcedo et al. |
| 8,198,651 B2 | 6/2012 | Langguth et al. |
| 8,222,698 B2 | 7/2012 | Salcedo et al. |
| 8,278,684 B1 | 10/2012 | Walker et al. |
| 8,331,069 B2 | 12/2012 | Galy et al. |
| 8,368,116 B2 | 2/2013 | Salcedo et al. |
| 8,416,543 B2 | 4/2013 | Salcedo |
| 8,432,651 B2 | 4/2013 | Salcedo et al. |
| 8,462,477 B2 | 6/2013 | Modica et al. |
| 8,466,489 B2 | 6/2013 | Salcedo et al. |
| 8,476,684 B2 | 7/2013 | Coyne et al. |
| 8,553,380 B2 | 10/2013 | Salcedo |
| 8,592,860 B2 | 11/2013 | Salcedo et al. |
| 8,610,251 B1 | 12/2013 | Salcedo |
| 8,633,509 B2 | 1/2014 | Salcedo |
| 8,637,899 B2 | 1/2014 | Salcedo |
| 8,665,571 B2 | 3/2014 | Salcedo et al. |
| 8,680,620 B2 | 3/2014 | Salcedo et al. |
| 8,772,091 B2 | 7/2014 | Salcedo et al. |
| 8,796,729 B2 | 8/2014 | Clarke et al. |
| 8,829,570 B2 | 9/2014 | Salcedo et al. |
| 8,860,080 B2 | 10/2014 | Salcedo et al. |
| 8,946,822 B2 | 2/2015 | Salcedo et al. |
| 8,947,841 B2 | 2/2015 | Salcedo et al. |
| 9,520,486 B2 | 12/2016 | Coyne et al. |
| 2001/0031521 A1 | 10/2001 | Pan et al. |
| 2001/0040254 A1 | 11/2001 | Takiguchi |
| 2001/0050374 A1 | 12/2001 | Yoshitake |
| 2002/0021538 A1 | 2/2002 | Chen et al. |
| 2002/0033520 A1 | 3/2002 | Kunikiyo |
| 2002/0074604 A1 | 6/2002 | Wang et al. |
| 2002/0081783 A1 | 6/2002 | Lee et al. |
| 2002/0109190 A1 | 8/2002 | Ker et al. |
| 2002/0122280 A1 | 9/2002 | Ker et al. |
| 2002/0125931 A1 | 9/2002 | Yue et al. |
| 2002/0140050 A1 | 10/2002 | Bohlin et al. |
| 2002/0153564 A1 | 10/2002 | Shirai |
| 2002/0153571 A1 | 10/2002 | Mergens et al. |
| 2002/0187601 A1 | 12/2002 | Lee et al. |
| 2003/0038298 A1 | 2/2003 | Cheng et al. |
| 2003/0076636 A1 | 4/2003 | Ker et al. |
| 2003/0116785 A1 | 6/2003 | D'Anna et al. |
| 2003/0147190 A1 | 8/2003 | Ker et al. |
| 2003/0151877 A1 | 8/2003 | Young et al. |
| 2003/0168701 A1 | 9/2003 | Voldman |
| 2003/0197543 A1 | 10/2003 | Imai |
| 2003/0209758 A1 | 11/2003 | Lee et al. |
| 2004/0027745 A1 | 2/2004 | Kunz et al. |
| 2004/0048428 A1 | 3/2004 | Tanomura |
| 2004/0135229 A1 | 7/2004 | Sasahara |
| 2004/0164354 A1 | 8/2004 | Mergens et al. |

(56) References Cited

U.S. PATENT DOCUMENTS

| | | |
|---|---|---|
| 2004/0190208 A1 | 9/2004 | Levit |
| 2004/0195644 A1 | 10/2004 | Mallikarjunaswamy |
| 2004/0207021 A1 | 10/2004 | Russ et al. |
| 2004/0240128 A1 | 12/2004 | Boselli et al. |
| 2005/0012155 A1 | 1/2005 | Ker et al. |
| 2005/0047037 A1* | 3/2005 | Litwin .............. H01L 27/0266 361/56 |
| 2005/0057866 A1 | 3/2005 | Mergens et al. |
| 2005/0077571 A1 | 4/2005 | Kanda et al. |
| 2005/0082618 A1 | 4/2005 | Wu et al. |
| 2005/0087807 A1 | 4/2005 | Righter |
| 2005/0088794 A1 | 4/2005 | Boerstler et al. |
| 2005/0093069 A1 | 5/2005 | Logie |
| 2005/0111150 A1 | 5/2005 | Jang et al. |
| 2005/0133869 A1 | 6/2005 | Ker et al. |
| 2005/0151160 A1 | 7/2005 | Salcedo et al. |
| 2005/0195540 A1 | 9/2005 | Streibl et al. |
| 2005/0280091 A1 | 12/2005 | Huang et al. |
| 2006/0033163 A1 | 2/2006 | Chen |
| 2006/0091497 A1 | 5/2006 | Sato |
| 2006/0109595 A1 | 5/2006 | Watanabe et al. |
| 2006/0145260 A1 | 7/2006 | Kim |
| 2006/0186467 A1 | 8/2006 | Pendharkar et al. |
| 2006/0250732 A1 | 11/2006 | Peachey |
| 2007/0007545 A1 | 1/2007 | Salcedo et al. |
| 2007/0058307 A1 | 3/2007 | Mergens et al. |
| 2007/0087500 A1 | 4/2007 | Son et al. |
| 2007/0138558 A1 | 6/2007 | Saitoh |
| 2007/0158748 A1 | 7/2007 | Chu et al. |
| 2008/0044955 A1 | 2/2008 | Salcedo et al. |
| 2008/0067601 A1 | 3/2008 | Chen |
| 2008/0203534 A1 | 8/2008 | Xu et al. |
| 2008/0218920 A1 | 9/2008 | Vanysacker et al. |
| 2008/0237707 A1 | 10/2008 | Suzuki et al. |
| 2009/0032837 A1 | 2/2009 | Tseng et al. |
| 2009/0032838 A1 | 2/2009 | Tseng et al. |
| 2009/0034137 A1 | 2/2009 | Disney et al. |
| 2009/0045457 A1 | 2/2009 | Bodbe |
| 2009/0057715 A1 | 3/2009 | Ryu et al. |
| 2009/0080128 A1 | 3/2009 | Tsuchihashi |
| 2009/0122452 A1 | 5/2009 | Okushima |
| 2009/0206376 A1 | 8/2009 | Mita et al. |
| 2009/0230426 A1 | 9/2009 | Carpenter et al. |
| 2009/0231766 A1 | 9/2009 | Chang et al. |
| 2009/0236631 A1 | 9/2009 | Chen et al. |
| 2009/0309128 A1 | 12/2009 | Salcedo et al. |
| 2010/0027174 A1 | 2/2010 | Galy et al. |
| 2010/0059028 A1 | 3/2010 | Ueno |
| 2010/0109631 A1 | 5/2010 | Vinson |
| 2010/0121404 A1 | 5/2010 | Bjorling et al. |
| 2010/0133583 A1 | 6/2010 | Mawatari et al. |
| 2010/0148265 A1 | 6/2010 | Lin et al. |
| 2010/0155858 A1 | 6/2010 | Chen |
| 2010/0163973 A1 | 7/2010 | Nakamura et al. |
| 2010/0163986 A1 | 7/2010 | Kim |
| 2010/0171149 A1 | 7/2010 | Denison et al. |
| 2010/0232081 A1* | 9/2010 | Disney .............. H01L 27/0266 361/91.5 |
| 2010/0301389 A1 | 12/2010 | Kushner et al. |
| 2010/0321092 A1 | 12/2010 | Momota et al. |
| 2010/0327343 A1 | 12/2010 | Salcedo et al. |
| 2011/0101444 A1 | 5/2011 | Coyne et al. |
| 2011/0110004 A1 | 5/2011 | Maier |
| 2011/0133246 A1 | 6/2011 | Ueno |
| 2011/0176244 A1 | 7/2011 | Gendron et al. |
| 2011/0181991 A1 | 7/2011 | Tailliet |
| 2011/0207409 A1 | 8/2011 | Ker et al. |
| 2011/0284922 A1 | 11/2011 | Salcedo et al. |
| 2011/0291738 A1* | 12/2011 | Biela .............. H03K 17/08142 327/430 |
| 2011/0303947 A1 | 12/2011 | Salcedo et al. |
| 2011/0304944 A1 | 12/2011 | Salcedo et al. |
| 2012/0007138 A1 | 1/2012 | Nguyen |
| 2012/0091503 A1 | 4/2012 | Su |
| 2012/0133025 A1 | 5/2012 | Clarke et al. |
| 2012/0175673 A1 | 7/2012 | Lee |
| 2012/0182659 A1 | 7/2012 | Wang et al. |
| 2012/0194953 A1 | 8/2012 | Mikolajczak |
| 2012/0199874 A1 | 8/2012 | Salcedo et al. |
| 2012/0205714 A1 | 8/2012 | Salcedo et al. |
| 2012/0286325 A1 | 11/2012 | Coyne |
| 2012/0286327 A1 | 11/2012 | Coyne |
| 2012/0286396 A1 | 11/2012 | Coyne |
| 2012/0293904 A1 | 11/2012 | Salcedo et al. |
| 2013/0099280 A1 | 4/2013 | Coyne |
| 2013/0208385 A1 | 8/2013 | Salcedo et al. |
| 2013/0234209 A1 | 9/2013 | Parthasarathy et al. |
| 2013/0242448 A1 | 9/2013 | Salcedo et al. |
| 2013/0270605 A1 | 10/2013 | Salcedo et al. |
| 2013/0330884 A1 | 12/2013 | Salcedo et al. |
| 2014/0138735 A1 | 5/2014 | Clarke et al. |
| 2014/0167104 A1 | 6/2014 | Salcedo |
| 2014/0167105 A1 | 6/2014 | Salcedo et al. |
| 2014/0167106 A1 | 6/2014 | Salcedo |
| 2014/0339601 A1 | 11/2014 | Salcedo et al. |
| 2014/0346563 A1 | 11/2014 | Salcedo et al. |
| 2017/0117266 A1 | 4/2017 | Coyne et al. |

FOREIGN PATENT DOCUMENTS

| | | |
|---|---|---|
| EP | 0 234 269 A2 | 9/1987 |
| EP | 0508975 A1 | 10/1992 |
| EP | 0 730 293 | 9/1996 |
| EP | 1 703 560 A2 | 9/2006 |
| EP | 2 246 885 A1 | 11/2010 |
| JP | 2004-533713 | 11/2004 |
| JP | 2008-147527 | 6/2008 |
| KR | 10-2006-0067100 | 2/2006 |
| KR | 10-2009-0123683 | 12/2009 |
| KR | 10-2010-0003569 | 1/2010 |
| TW | 200644735 | 12/2006 |
| TW | 200733305 | 9/2007 |
| WO | WO 90/15442 A1 | 12/1990 |
| WO | WO 1995/022842 A1 | 8/1995 |
| WO | WO 1997/10615 A1 | 3/1997 |
| WO | WO 2008/135812 A1 | 11/2008 |
| WO | WO 2010/011394 A1 | 1/2010 |
| WO | WO 2012/154875 A1 | 11/2012 |

OTHER PUBLICATIONS

Salcedo et al., Bidirectional Devices for Automotive-Grade Electrostatic Discharge Applications, IEEE Electron Device Letters, vol. 33, No. 6, Jun. 2012, 3 pages.

Anderson et al., ESD Protection under Wire Bonding Pads, EOS/ESD Symposium 99-88, pp. 2A.4.1-2A.4.7 (1999).

Luh et al. A Zener-Diode-Activated ESD Protection Circuit for Sub-Micron CMOS Processes, Circuits and Systems, IEEE International Symposium, May 28-31, 2000, Geneva, Switzerland, 4 pages.

Salcedo et al., Electrostatic Discharge Protection Framework for Mixed-Signal High Voltage CMOS Applications, IEEE Xplore, downloaded Feb. 23, 2010 at 12:53 EST, 4 pages.

Chang et al., High-k Metal Gate-bounded Silicon Controlled Rectifier for ESD Protection, 34th Electrical Overstress/Electrostatic Discharge Symposium, Sep. 2012, 7 pages.

Salcedo et al., On-Chip Protection for Automotive Integrated Circuits Robustness, 2012 8th International Caribbean Conference on Devices, Circuits and Systems (ICCDCS), 5 pages, Mar. 2012.

De Heyn et al "Design and Analysis of New Protection Structures for Smart Power Technology with Controlled Trigger and Holding Voltage" 2001 IEEE International Reliability Physics Symposium Proceedings 39th Annual, Orlando Florida, Apr. 30-May 3, 2001, IEEE International Reliability Physics Symposium, New York, NY, IEEE Apr. 30, 2001, pp. 253-258.

Gendron et al., "Deep Trench NPN Transistor for Low-RON ESD Protection of High-Voltage I/Os in Advance Smart Power Technology," BIPOLAR/BICMOS Circuits and Technology Meeting, IEEE, Oct. 1, 2006, pp. 1-4.

(56) References Cited

OTHER PUBLICATIONS

Urresti et al., "Lateral Punch-Through TVS Devices for on-Chip Protection in Low-Voltage Applications," Microelectronics Reliability, 2005, pp. 1181-1186, vol. 45.
Walker et al., "Novel Robust High Voltage ESD Clamps for LDMOS Protection," 45th Annual International Reliability Physics Symposium, 2007, IEEE International, Apr. 1, 2007, pp. 596-597.
AD524, Analog Devices, "Precision Instrumentation Amplifier," dated Nov. 2007, in 28 pages.
Salcedo, Javier A., "Design and Characterization of Novel Devices for New Generation of Electrostatic Discharge (ESD) Protection Structures" PhD Dissertation, Summer Term 2006, in 198 pages.
Chinese Office Action dated Apr. 29, 2014 for Chinese Application No. 201080049940.X filed Oct. 4, 2010. 16 pages.
Chinese Office Action dated Oct. 30, 2014 for Chinese Application No. 201080049940.X, filed Oct. 4, 2010. 6 pages.
EPO Communication and Response pursuant to Rules 161 (1) and 162 EPC of Jun. 13, 2012 for European Application No. 10733187.8. 2 pages.
Partial International Search Report dated Dec. 8, 2010 for International application PCT/US2010/051356. 10 pages.
Taiwanese office action with Translation dated Mar. 10, 2015, in TW application No. 099136457. 21 pages.
Written Opinion of the International Preliminary Examining Authority for application PCT/US2010/051356, dated Jan. 25, 2012, 32 pages.
International Preliminary Report on Patentability dated Mar. 1, 2012 for International Application No. PCT/US2010/051356. 18 pages.
European office action dated May 13, 2015, in EP application No. 10766187.8. 6 pages.
Invitation to Pay Additional Fees for International Application No. PCT/US2010/051356 dated Mar. 29, 2011, in 6 pages.
Extended European Search Report for European Patent App. No. 15183728.3, dated Mar. 3, 2016, in 7 pages.
Oct. 8, 2016 Office Action from CN Application No. 201280022685. 9.
Jun. 13, 2012 EPO Communication and Response pursuant to Rules 161 (1) and 162 EPC re Application No. 10733187.8. 2 pages.
May 13, 2015 European Office Action re application No. 10766187.8. 6 pages.
Sep. 27, 2017 Office Action in EP Application No. 12722248.7.
Nov. 18, 2014 Office Action from JP Application No. 2014-510420.
Jul. 23, 2015 Office Action from JP Application No. 2014-510420.
Jul. 25, 2012 Int'l Search Report for Int'l App. No. PCT/US2012/037154.
Nov. 12, 2013 International Preliminary Report on Patentability from Int'l Application No. PCT/US2012/037154.
Nov. 21, 2013 International Preliminary Report on Patentability from Int'l Application No. PCT/US2012/037160.
Oct. 10, 2012 Int'l Search Report for Int'l Application No. PCT/US2012/037160.
Jul. 23, 2012 Invitation to Pay Additional Fees for Int'l. App. No. PCT/US2012/037160.
Jul. 20, 2012 International Search Report and Written Opinion for Int'l App. No. PCT/US2012/037028.
Nov. 21, 2013 International Preliminary Report on Patentability from Int'l Application No. PCT/US2012/037028.
Apr. 10, 2013 Office Action from U.S. Appl. No. 13/105,667.
Jan. 14, 2014 Notice of Allowance from U.S. Appl. No. 13/105,667.
Mar. 12, 2013 Office Action from U.S. Appl. No. 13/279,122.
Jun. 6, 2011 International Search Report and Written Opinion re Application No. PCT/US2010/051356 (22 pgs).
Sep. 28, 2017 International Preliminary Report on Patentability re Application No. PCT/US2016/022364, (10 pages).
Amerasekera, et al. "ESD in Silicon Integrated Circuits," John Wiley & Sons (1995) pp. 44-49.
Baliga, "Silicon RF Power Mosfets", World Scientific, 2005, Chapter 4 Lateral-Diffused MOSFETs, 33 pages.

\* cited by examiner

OVERVOLTAGE BLOCKING PROTECTION DEVICE

FIELD

The present disclosure relates to overvoltage protection devices for protecting electronic circuits against overvoltage events and/or electrostatic discharge events.

BACKGROUND

Electronic systems may be operated in environments and/or in circuits where they have the potential to be exposed to a transient electrical event that is an electrical signal of relatively short duration but having a high or rapidly changing voltage that exceeds the normal operating voltage for that electronic system. Transient electrical events can include, for example, electrostatic discharge events arising from the abrupt release of charge from an object or person to an electronic circuit. Such electrostatic discharge (ESD) or electrical over stress (EOS) events may include "body" discharge events and "machine" discharge events. Various organizations, such as the Joint Electronic Device Engineering Council (JEDEC), the International Electrotechnical Commission (IEC), the Automotive Engineering Council (AEC), and the International Organization for Standardization (ISO), set standards for such discharge events.

Body discharge events describe the ESD events where a person who has become charged may discharge their electrostatic charge through contact with an electronic circuit. Such events are measured, for example, by looking at the circuit performance one hundred nanoseconds after the initiation of the discharge event. Machine events such as the IEC charged device model (IECCDM) measure device performance after a period of around 600 picoseconds after initiation of the discharge. Such short time scale ESD events may give rise to gate oxide damage in metal oxide semiconductor field effect transistors (MOSFETs), or to junction damage or charge trapping within integrated circuits. Furthermore, even if the transient event does not induce physical damage to the device, it may induce latch up (the inadvertent creation of a low impedance path) thereby disrupting the functioning of the integrated circuit and potentially giving rise to permanent damage to the integrated circuit from self-heating in the latch up current path. There is therefore a need to provide an integrated circuit with protection from transient electrical events.

It is also desirable to provide overvoltage protection circuits that have a controllable trigger voltage and a controllable "snap back" voltage which represents a holding voltage. Overvoltage protection circuits can be provided with a holding voltage that is less than the trigger voltage but greater than the device supply rail voltage.

SUMMARY

According to a first aspect of this disclosure there is provided an overvoltage protection device for a circuit having a node to be protected and an input node. The overvoltage protection device comprises a first field effect transistor having a first current flow node, a second current flow node, and a gate. The first current flow node is operatively coupled to the input node and the second current flow node is operatively coupled to the node to be protected. The gate is connected to a control node. The first field effect transistor is conductive when a voltage difference between either of the first and the second current flow nodes and the gate is less than a predetermined value, and is substantially non-conducting or acting as a voltage controlled resistance when the voltage difference exceeds the predetermined value. The overvoltage protection device further comprises an overvoltage protection cell that is normally high impedance but which can become conducting in response to an overvoltage event. The overvoltage protection cell is connected between one of the first and second current flow nodes and a current discharge path.

It is thus possible to use the rapid response of a field effect transistor to place a relatively high-impedance path between the input node and the node to be protected. In certain configurations, the field effect transistor is a junction FET. The use of a junction FET removes the risk of gate oxide damage associated with a MOSFET transistor. However, provided precautions are taken to prevent gate damage, insulated gate devices may be used. The first field effect transistor should provide a relatively low impedance path between the input node and the node to be protected during normal use, i.e. in the absence of ESD or EOS events. This can be achieved by use of a depletion mode device.

Advantageously the overvoltage protection cell is coupled between the input node and a current discharge path. Advantageously the overvoltage protection cell comprises one or more semiconductor devices, such as diodes or bipolar junction transistors whose breakdown voltages can be configured to set a desired breakdown voltage and which are arranged to carry the expected discharge current safely from the input node to the current discharge path without becoming damaged themselves and without overstressing the first field effect transistor.

According to a second aspect of this disclosure there is provided an integrated circuit including at least one overvoltage protection device in accordance with the first aspect of this disclosure.

According to a third aspect of this disclosure there is provided a method of protecting a node to be protected from an electrical overvoltage or over stress event. The method comprises placing a voltage controlled impedance in a signal path to the node to be protected, and increasing the impedance of the voltage controlled impedance in response to the voltage in the signal path exceeding a threshold voltage. In certain configurations, the voltage controlled impedance comprises a voltage controlled resistance, and the method further includes increasing the resistance of the voltage controlled resistance in response to the voltage in the signal path exceeding the threshold voltage.

Advantageously a further discharge path is provided by one or more devices connected between the voltage controlled impedance and a current discharge path, where the further devices are in a high-impedance state when the voltage in the signal path is less than a second threshold value, and a transition to a low-impedance state when the voltage across those devices exceeds the second threshold value.

BRIEF DESCRIPTION OF THE DRAWINGS

Embodiments of this disclosure will now be described by way of non-limiting example with reference to the accompanying drawings, in which.

DETAILED DESCRIPTION OF EMBODIMENTS

Terms such as above, below, over and so on as used herein refer to a device orientated as shown in the figures and should be construed accordingly. It should also be appreciated that because regions within a semiconductor device (such as a transistor) are defined by doping different parts of a semiconductor material with differing impurities or differing concentrations of impurities, discrete physical boundaries between different regions may not actually exist in the completed device but instead regions may transition from one to another. Some boundaries as shown in the accompanying figures are of this type and are illustrated as abrupt structures merely for the assistance of the reader. In the embodiments described below, p-type regions can include a p-type semiconductor material, such as boron, as a dopant. Further, n-type regions can include an n-type semiconductor material, such as phosphorous, as a dopant. A skilled artisan will appreciate various concentrations of dopants in regions described below.

It is desirable for overvoltage or ESD protection circuits to respond rapidly and to be able to carry sufficient current in order return the voltage at a node to acceptable values, for example by discharging a capacitive body that gave rise to the ESD event. However there is a fundamental tension in the device physics of semiconductors that make fast response and good current carrying capabilities competing objectives for a device of any reasonable size. Increasing a device size can go some way towards mitigating these competing objectives, but adds the overhead of significant area on the integrated circuit die and the introduction of undesirable parasitic capacitances which can affect circuit loading.

Figure 1:
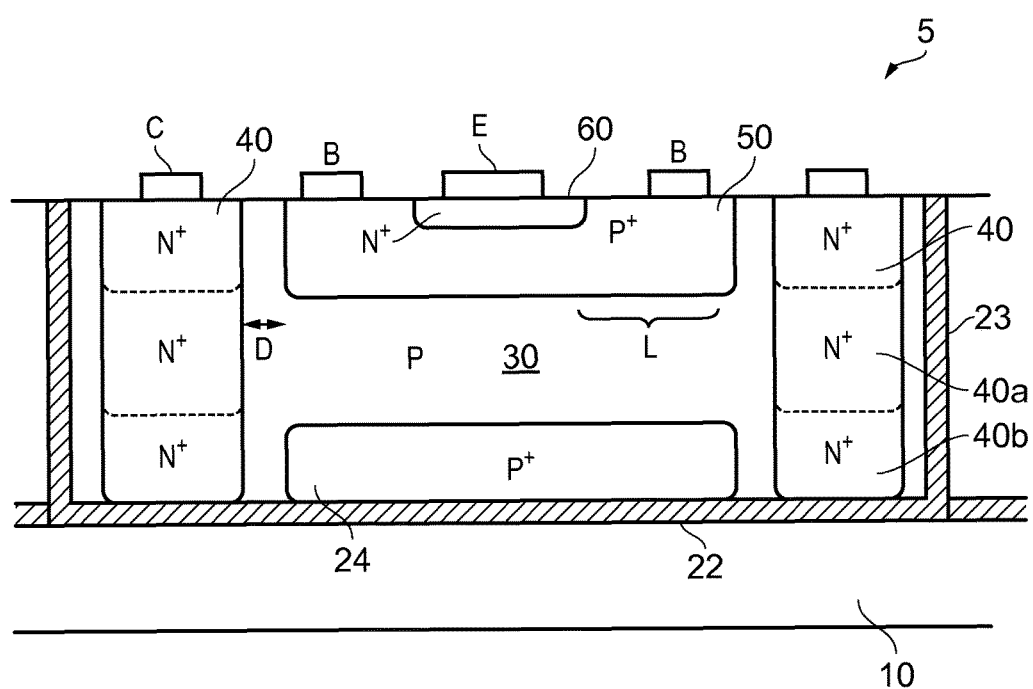
FIG. 1 is a schematic view of a layout adjustable overvoltage protection device that is suitable for providing protection against certain electrical overvoltage stress events.

US 2011/0101444 discloses an overvoltage protection device 5, as shown in FIG. 1 of this disclosure, based around a horizontal NPN transistor which is formed within an insulated well. Although FIG. 1 illustrates a protection device that is fabricated using a silicon on insulator (SOI) process, it will be understood that the disclosure is not limited to SOI transistors. For example, the teachings herein are applicable to wide variety of overvoltage protection devices, including, for example, isolated well devices.

In FIG. 1 a substrate 10 is provided, which acts as a carrier wafer. A layer of insulation 22, such as silicon oxide is formed over the substrate 10. Similar insulation is also used to form walls 23 in the finished device. In the illustrated configuration, a relatively highly doped P$^+$ region 24 is provided over the layer of insulation 22 beneath the base region 50. The P+ region 24 may be grown by epitaxial deposition and subsequent ion implantation. This also allows for further doped areas around the region 24 to be grown, for example the N$^+$ areas towards the edges of the device. An epitaxial layer 30 of P-type material is provided over the P$^+$ region 24. The epitaxial layer 30 of P-type material forms a body of the overvoltage protection device. The P$^+$ region 24 acts to inhibit the formation of vertical transistors beneath the horizontal NPN transistor of the overvoltage protection device and, also being heavily doped, helps to shield the base region and the emitter region of the overvoltage protection device from electrostatic fields resulting from the epitaxial layer 30 being at a different potential relative to the substrate 10.

A first N-type region 40 is formed, as shown in FIG. 1, towards the left hand side of the device. However the device 5 in this example has rotational symmetry such that the same region 40 also exists on the right hand side of the device 5 and indeed above and below the plane of the figure. This region forms a collector of the transistor.

A P+ region 50 is implanted to form the base region, and the P$^+$ region 50 is spaced apart from the N-type region 40. A further N$^+$ region 60 that forms the emitter is implanted within the P$^+$ region 50. As the transistor is deliberately fabricated as a horizontal structure the collector regions 40 need only be provided in the vicinity of the surface. However, the N$^+$ region 40 can be extended by forming region 40a, or regions 40a and 40b as illustrated. It will be appreciated that as the device may be formed by growing an epitaxial layer over the initial (handle) wafer, then region 40b may be implanted or otherwise doped before the layer containing region 40a is grown on the wafer. Similarly region 40a may be implanted with dopant before a top layer containing the region 40 is grown on the wafer.

Contacts to the collector, base and emitter regions 40, 50 and 60 are formed at the surface of the device and are designated C, B and E, respectively.

For a bidirectional overvoltage protection device that is able to provide protection against an electrostatic discharge event of either polarity or an overvoltage event of either polarity (e.g. $V_{EOS}$<Vss or $V_{EOS}$>Vdd where $V_{EOS}$ is the overvoltage) it is preferable for the regions 40 and 60 to be doped to a similar concentration such that either can function as the collector or the emitter of the lateral NPN transistor. However in certain configurations, such as unidirectional configurations or configurations in which an asymmetric overvoltage protection response is desired, the transistor may be fabricated such that it has one region whose performance is enhanced when that region is used as the emitter.

In the example discussed here the N-type regions 40 and 60 in a symmetric device are doped to around, for example, $10^{19}$ donor impurities per cubic centimeter, the base region may be doped to around, for example, $10^{18}$ acceptor impurities per cubic centimeter, whilst the epitaxial layer 30 associated with the P-type body is more lightly doped at around, for example, $10^{15}$ acceptor impurities per cubic centimeter. The overvoltage protection device of FIG. 1 triggers automatically for ESD/EOS events of sufficient positive or negative voltage. The trigger voltage of the device can be controlled by selecting the lateral extent of a distance D between the edge of the collector region 40 and the edge of the base region 50. Furthermore, the holding voltage of the device can be controlled by adjusting the distance L representing the width of the base region of the device.

The distances D and L can be selected at production by the use of mask positioning. Thus by controlling the distances D and L the voltage at which the device switches on (through a punch through trigger mechanism) can be controlled. Device triggering can also be controlled through adjusting impact ionization driven breakdown mechanisms.

Such a device meets the transmission line pulse (TLP) test requirements associated with certain ESD events in terms of its transient response. It also provides a good current handling density.

However the response time of the horizontal NPN transistor that provides the overvoltage and ESD protection is constrained by device physics.

In broad and slightly simplistic terms, the current flow in a semiconductor device can be attributed to a combination of minority carrier current flow and to majority carrier current flow. Typically majority carrier current flow mechanisms are relatively fast, whereas minority carrier current flow mechanisms are relatively slow.

If we return to consider the device of FIG. 1 its turn on time is initially dominated by impact ionization driven mechanisms. Thus, when the voltage across the device rises the voltage between the collector and base gives rise to impact ionization which has a very rapid (for example sub picosecond) response time as it is a majority carrier breakdown event. However, the impact initiated breakdown is then used to inject electrons into the P-type material 50 of the bipolar transistor and this is a minority carrier current flow mechanism which is somewhat slower. This gives rise to a restriction in the natural turn on time of such a device.

Figure 2:
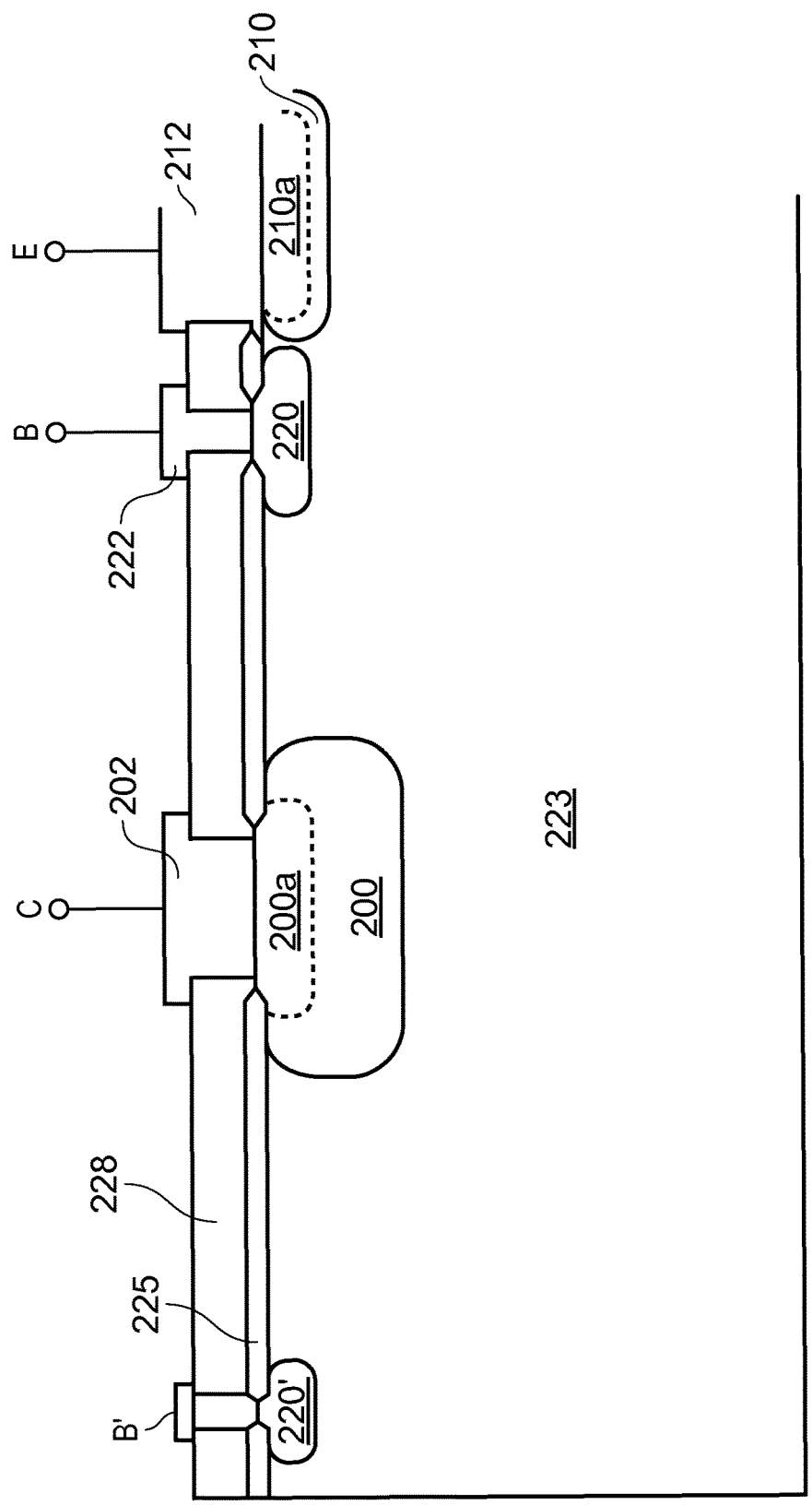
FIG. 2 shows a layout of a lateral NPN transistor whose turn on performance was simulated and shown in FIGS. 3a to 3d.

Transistor operation has been simulated for the lateral NPN transistor whose structure is shown in FIG. 2. The transistor shown in FIG. 2 comprises a collector region 200 formed beneath a collector contact 202. An emitter region 210 is provided beneath an emitter contact 212; and a base region 220 is provided beneath a base contact 222. All of the emitter base and collector regions are provided within an epitaxial layer 223. The regions 200 and 210 are (in this example) N-type doped silicon and the region 220 is P-type silicon. Additionally very highly doped regions 200a and 210a may be provided adjacent the collector and emitter contacts where the silicon is doped to its limit or near to its limit in order to provide low resistance interface regions with the collector and emitter contacts 200 and 212, respectively.

The surface of the device is covered with a layer of passivation, such as an oxide layer 225. In the illustrated configuration, the surface of the device further includes a further insulating layer 228, which may be a silicon oxide, a silicon nitride or other suitable dielectric material. Although the transistor described is an NPN device, it will be appreciated that a PNP transistor could also be formed by swapping all the device dopings. In particular, a PNP transistor could be formed by swapping N-type dopings for P-type dopings and by swapping P-type dopings for N-type dopings.

Optionally, a second base contact B' formed by a diffusion 220' and an associated connection or contact can be made to the other side of the collector 200 as shown. The second base contact B' makes the device more electrically symmetric and helps to prevent lateral punch through where the depletion region from the collector travels around the device to the emitter.

FIGS. 3a to 3d show the evolution of the areas of impact ionization and the boundary depletion regions after periods of 0.4 picoseconds, 0.6 picoseconds, 15 nanoseconds and 100 nanoseconds respectively after the application of an ESD event. In each of the figures the edge of the collector doping is represented by the broken line 300 and the spatial extent of the depletion region is denoted by the chain-dot line 302. Those areas where there significant amounts of impact ionization are denoted by the shaded areas 310, and areas of lesser by still significant impact ionization are denoted by the shaded areas 320.

Figure 3A:
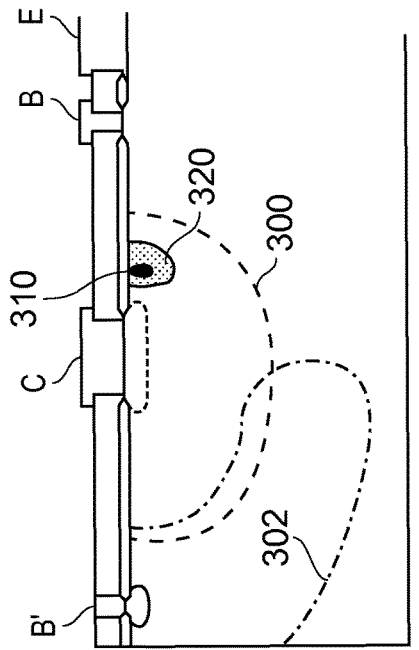
FIGS. 3a to 3d show the evolution of areas of impact ionization and depletion region boundaries within the transistor of FIG. 2 for $4\times10^{-12}$, $6\times10^{-12}$, $15\times10^{-9}$ and $100\times10^{-9}$ seconds after initiation of an overvoltage event, respectively.
Figure 3B:
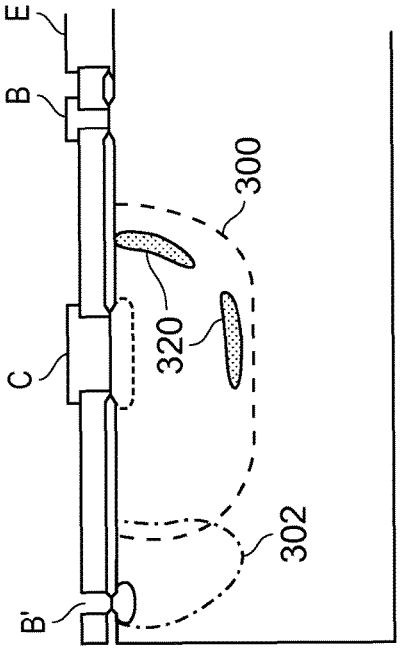
Figure 3C:
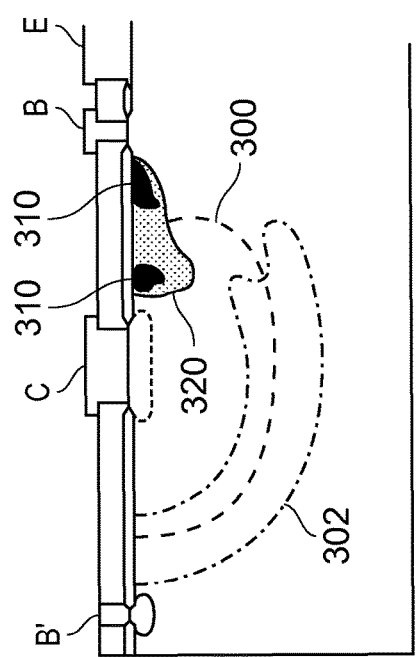
Figure 3D:
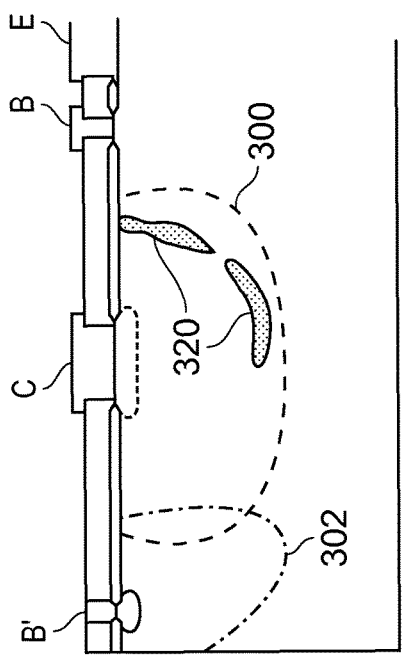

Impact ionization tends to be concentrated in areas of high field strength or areas of moderate field strength and high current density. Working through the figures it can be seen that, as shown in FIG. 3a, after 0.4 picoseconds diode breakdown of the collector-based diode in the transistor has initiated. Areas 310 exhibit large amounts of impact ionization. It can also be seen that for most of the device the depletion region 302 follows the profile that it has when the device is in a non-conducting state. After 0.6 picoseconds the device is starting to conduct collector current. As a result, and as shown in FIG. 3b, the area of impact ionization near the surface of the device starts to become reduced as the potential difference across that region becomes reduced by virtue of the transistor beginning to conduct. After 15 nanoseconds, as shown in FIG. 3c, the device is mainly turned on and very little change occurs in the period up to 100 nanoseconds by which time the device is fully turned on, FIG. 3d.

Figure 4:
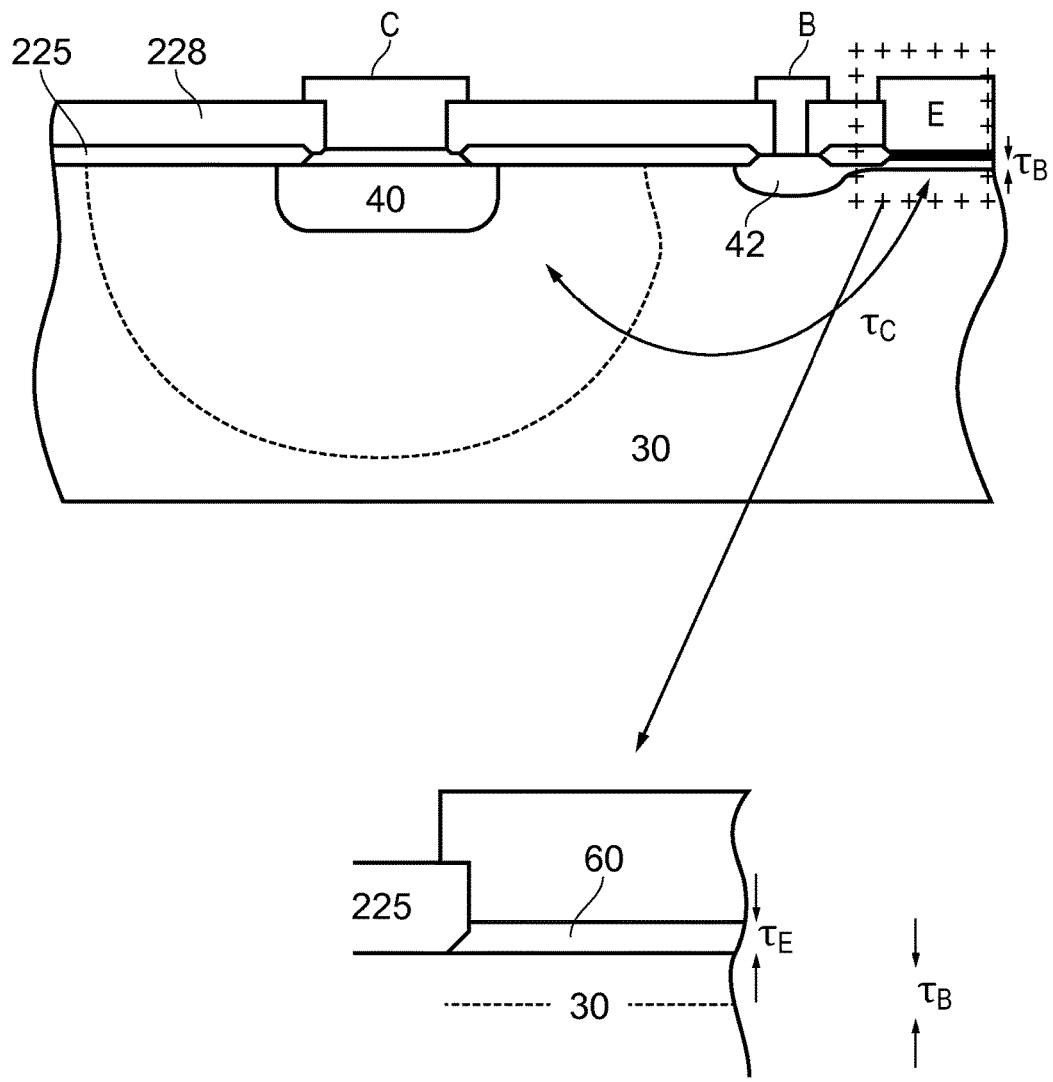
FIG. 4 is a cross-section through part of a lateral NPN transistor to diagrammatically illustrate the regions of the device that give rise to respective carrier transit times.

FIG. 4 shows one half of the transistor of FIG. 1 in greater detail where the surface of the device includes its layers of passivation, generally designated 225 (like in FIG. 2). It also shows time constants representing the carrier transit times $\tau_C$, $\tau_B$ and $\tau_E$ for the transit times of carriers across the collector, the base and the emitter regions, respectively. Generally, and as shown in FIG. 4, the emitter region is made quite thin and also the base should be relatively thin if a fast response is desired.

The overall transit time $\tau = \tau_E + \tau_B + \tau_C$ but generally $\tau_C$ is the dominant time.

To a first approximation, $$\tau_C = \frac{wc}{v_{sat}}$$

Where wc represents the depleted distance that the charges have to travel through the collector region from the base to the collector terminal, and $v_{sat}$ is the carrier saturation velocity within the semiconductor material.

Meanwhile the maximum voltage $V_{max}$ that a transistor can stand can be approximated by $v_{max} = \frac{1}{2} E_{max} wc$.

Therefore $$\frac{V_{max}}{\tau} = \frac{1}{2} v_{sat} E_{max}.$$

Where $E_{max}$ represents the maximum allowable field strength within the semiconductor before breakdown occurs. Therefore $$\frac{v_{max}}{\tau}$$

is a constant. As a result (for a given footprint on the die) fast devices cannot stand much voltage, whereas devices that can withstand a good voltage, as required by overvoltage protection systems, cannot be fast transistors.

Turn on speed is not the only factor that needs to be considered. Conducting the charge associated with the overvoltage event places demands on the current that a device can carry and the power that it can dissipate without damage.

The maximum current density Jmax that a unit volume of semiconductor can carry can be represented as:

$$J_{max} = q \cdot v_{sat} \cdot n_c$$

Where: q is the charge of the electron, $v_{sat}$ is the saturation velocity, and $n_c$ is the collector doping density.

In broad terms one can note that $$\frac{v_{max} \times j_{max}}{\tau} = \frac{1}{2} \varepsilon_{si} (E_{max})^2 (v_{sat})^2 \times \left(\frac{1}{wc}\right).$$

Most of the terms are constants related to the semiconductor material, whereas $$\frac{1}{wc}$$

is effectively related to the breakdown voltage. However, we also noted that at $v_{sat}$, wc becomes proportional to $\tau$. Therefore, there is also a trade-off between power dissipation per unit area of the device and the speed of the device.

Thus, faster devices have a lower power dissipation per unit area. As a consequence, if a manufacturer wished to take the bipolar technology described with respect to FIG. 1 to make it faster, then the silicon area required by the device could become very extensive.

Figure 5:
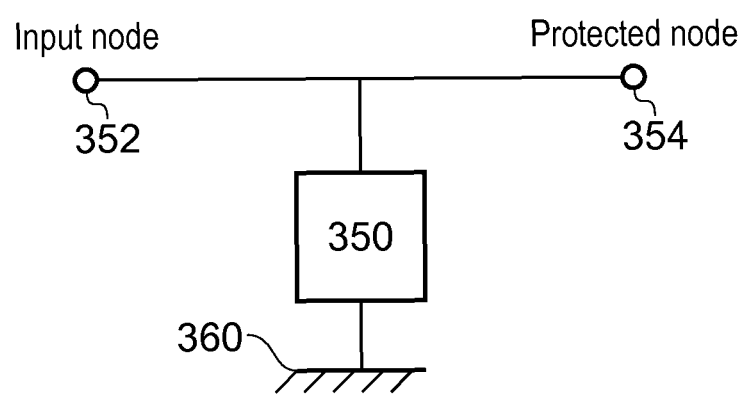
FIG. 5 is a circuit diagram of a normally high impedance overvoltage protection device deployed in an integrated circuit.

Conventionally, overvoltage protection devices, as represented by overvoltage protection cell 350 in FIG. 5 are connected to the input node 352 or the protected node 354 of a system and seek to provide a conduction path to ground 360 when a voltage threshold or trigger voltage is reached. It can be seen that the overvoltage protection cell 350 is normally high impedance and only becomes low impedance when responding to an electrical overvoltage event. The device needs to be able to pass the current associated with the overvoltage event. To make a fast device, whilst still being able to pass a suitable current, for example a maximum current of 12 amps during the surge event, such lateral NPN transistors can occupy die areas around, for example, 1 mm$^2$ per protection device. However if the device does not have to turn on so quickly, then it can be made much smaller.

Figure 6:
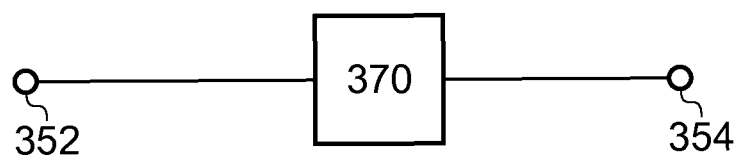
FIG. 6 is a circuit diagram representing deployment of a normally low impedance overvoltage protection device in accordance with embodiments.

The inventor realized that objectives of being able to provide a fast turn on whilst not consuming large amounts of die area can be achieved by providing a series connected overvoltage protection device. This device is normally low impedance and becomes high impedance in response to an overvoltage event. Such a device 370 is shown in FIG. 6 as being in series between the input node 352 and the node to be protected 354. Such a series connected input protection device 370 may optionally be provided in association with a parallel connected passive or active protection circuitry extending between the input node 352 and ground 360. Although a parallel connected protection circuit is described as being connected between the input node 352 and ground 360, protection circuits can be connected in other ways, including, for example, between the input node 352 and a power high or power low supply. A current flow blocking cell can be provided which provides protection during the initial phase of a transient event by converting into a high impedance state, or at least into a current flow limiting state where, for example, it acts as a voltage controlled resistor. Such a device can be implemented using a field effect transistor. A JFET is an advantageous choice as it removes the risk of gate oxide damage to the device. Such a device can transition rapidly into a pinch-off regime as the difference between the gate and the drain voltages increases.

Figure 7:
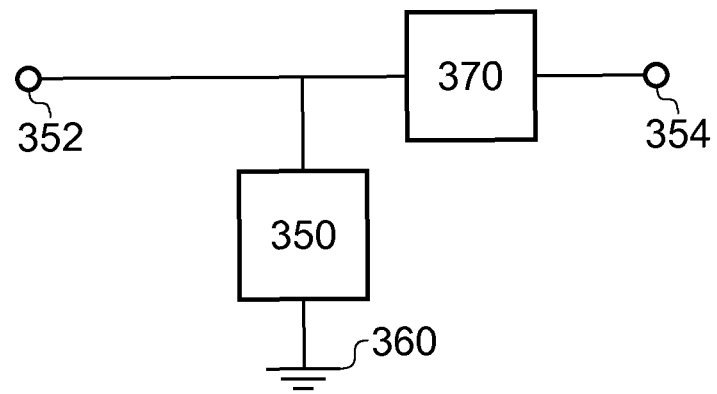
FIG. 7 shows a further variation on FIG. 6 including a normally low impedance overvoltage protection device in cooperation with a normally high impedance overvoltage protection device.
Figure 8:
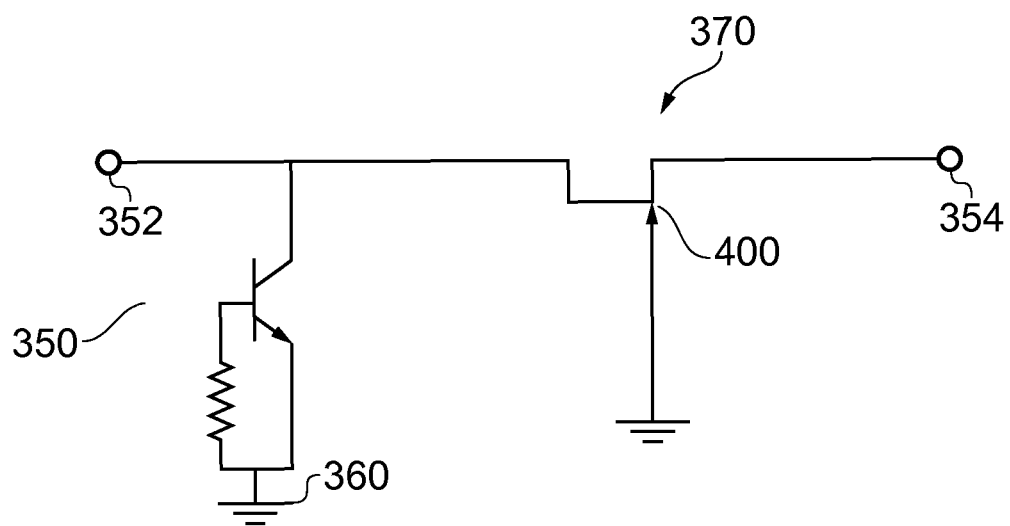
FIG. 8 is a circuit diagram of an embodiment of a protection circuit of FIG. 7 in greater detail.

FIG. 8 shows the arrangement of FIG. 7 is more detail, where the series connected protection device 370 is provided by a JFET transistor 400 having one of its drain and source connected to the input node 352 and the other of the drain and source connected to the node to be protected 354 where the JFET may be largely symmetric, or if the device is tailored for its high voltage capabilities then the drain is connected to the input node 352 and the source is connected to the node to be protected 354—as shown in FIG. 8. As used herein, one of a source or a drain of a FET can be referred to as a first current flow node and the other of the source or the drain of the FET can be referred to as a second current flow node.

Figure 9:
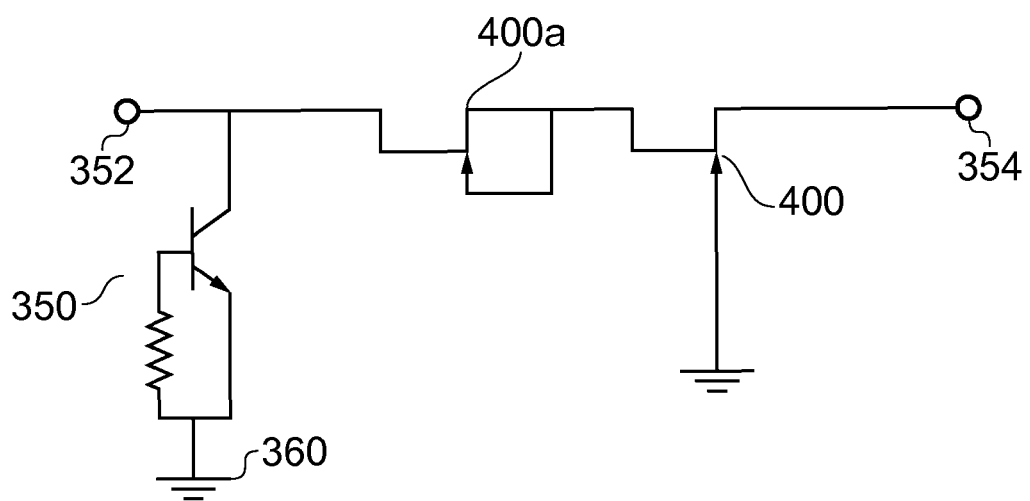
FIG. 9 is a circuit diagram of a protection circuit having two series connected transistors.

In the illustrated configuration, the gate of the JFET 400 is connected to the ground rail. The parallel connected protection device 350 can be formed from any suitable protection component, but the layout adjustable lateral NPN transistor described hereinbefore with reference to FIG. 1 is particularly versatile. A resistance may be connected between the base and emitter nodes to further modify the performance of the transistor as described in US 2011/0101444. The JFET 400 can be connected in series with another JFET 400a as shown in FIG. 9 to provide a higher breakdown voltage capability as the transistors can voltage share the applied voltage if either of them exhibits a small leakage current or if one starts to turn off before the other. In such an arrangement, the gate of the transistor 400a may be connected to ground or, as shown, to the drain of the first transistor 400. This latter configuration reduces the maximum voltage across the gate junction of the transistor 400a. Although FIG. 9 illustrates the JFET 400 connected in series with one additional JFET 400a, the teachings herein are also applicable to configurations in which the JFET 400 is connected in series with two or more additional JFETs.

Figure 10:
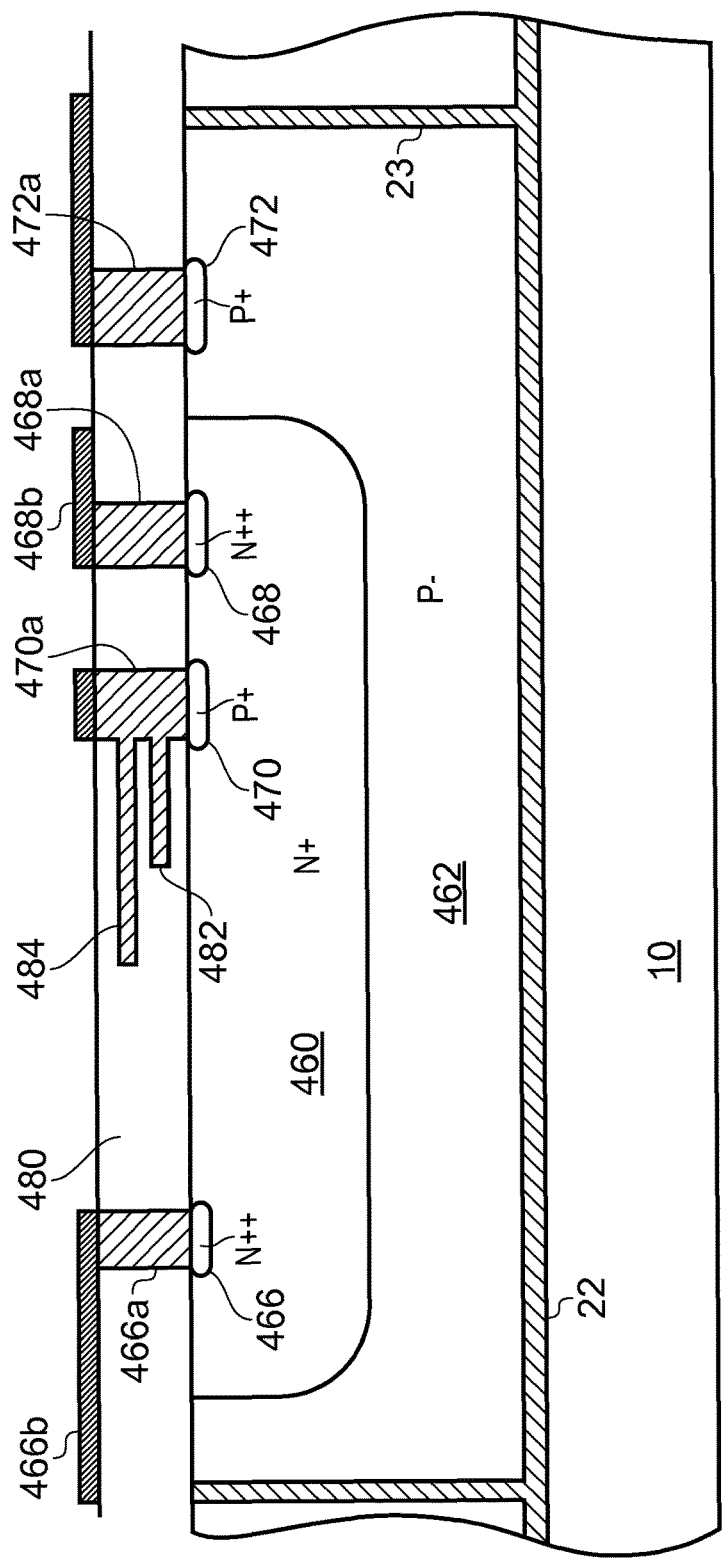
FIG. 10 is a schematic cross section through a junction field effect transistor (JFET) suitable for use in embodiments of this disclosure, and having been modified to enhance its maximum operating voltage by virtue of an increased drain to gate distance and the use of resurf mechanisms in the form of field plates.

A suitable JFET is illustrated in FIG. 10 where an $N^+$ diffusion 460 is formed within a P-type well 462. The P-type well 462 may be formed so as to be bounded by the layer of insulation 22 and insulated walls 23 as hereinbefore described with respect to FIG. 1. Highly doped N-type regions 466 and 468 connect with the $N^+$ region 460 to form drain, source and channel regions, respectively. Furthermore $P^+$ region 470 is also implanted into the N-type region 460 to form a top gate connection. The entire region 462 of the P type body material may connect via a further implanted region 472 to form a back gate. Each of these regions 466, 468, 470 and 472 are connected to respective surface contactors by way of respective contacts or vias 466a, 468a, 470a and 472a extending through an insulating layer 480 formed over the surface of the semiconductor. Furthermore, field plates 482 and 484 may be formed extending from the top gate connection towards the drain.

In the illustrated configuration, a first field plate 482 is positioned over the N+ diffusion 460, and extends from the gate contact 470a toward the drain contact 466a. Additionally, the second field plate 484 is positioned over the N+ diffusion 460 and the first field plate 482, and extends from the gate contact 470a toward the drain contact 466a. The first field plate 482 and the second field plate 484 are spaced apart from one another by a portion of the insulating layer 480, and a length of the second field plate 484 is greater than the length of the first field plate 482. The use of two horizontal spaced apart field plates enables the electric field gradient in the surface region of the semiconductor to be modified by different amounts at different places while allowing the fabrication of generally planar structures. Thus fewer processing steps are required to provide a field plate (resurf structure) using this approach compared to using a single field plate where the height of the plate is successively varied by the use of varying the thickness of a supporting insulator, such as silicon oxide.

The maximum voltage that this JFET transistor can withstand is partly determined by the length of the silicon between the top gate 470 and the drain 466. An increased length supports higher voltages, although it does increase the transit time for signals between the source 468 and drain 466 electrodes. The pinch off voltage at which the transistor ceases conduction is defined by the distance between the bottom of the top gate 470 and the top of the bottom gate 462. Where the top gate is shallow this means that the depth of the diffusion 460 controls the pinch off voltage, with shallow diffusions giving rise to a low pinch off voltage, and deep diffusions giving rise to an increased pinch off voltage. Thus the voltage at which the device becomes non-conducting can be set by the depth of the implant, and the maximum voltage that the device can withstand in its off state is set by the spatial extent of the device.

This allows the designer to tailor the response of the transistor such that it still responds rapidly to excess voltages, but does not become significantly resistive until the signal at the drain terminal exceeds the nominal operating voltage of the nodes to be protected by a sufficient margin. Connections to the drain and source regions are made by their respective vias 466a and 468a, and conductive tracks 466b and 468b. The gate 470 and the back gate 472 can be tied to a reference voltage such as ground. This stops the gate from floating, and also from becoming forward biased with respect to the signal being passed through the device provided that the signal is constrained to have a voltage between the ground and positive supply rail (or negative and positive supply rails) during normal operation of the integrated circuit incorporating the protection device. However, during an overstress event, the signal voltage level may fall outside this voltage range.

Figure 11:
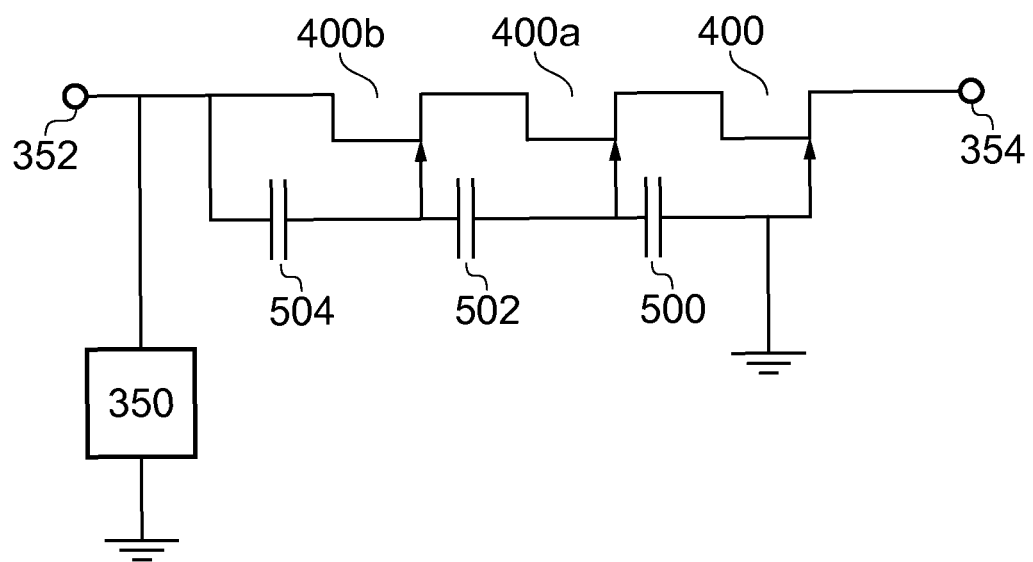
FIG. 11 shows a circuit in which a plurality of series connected transistors have their gates connected by way of a capacitive divider so as to share the overvoltage between them.

With reference to FIG. 11, multiple JFETs 400, 400a, 400b can be connected in series to increase the maximum voltage capability of the protection circuit. The transistors may be formed in isolated wells, for example as used in silicon on insulator technologies and this is likely to be used to form the parallel connected lateral NPN transistor so in certain configurations there is no additional cost overhead in using this technique to form the JFETs. However, it is advantageous to make sure the JFETs share the applied voltage between them in a substantially equal manner. This can be achieved by connecting a plurality of capacitors 500, 502 and 504 between ground and the input node 352 such that the capacitors 500, 502 and 504 form a capacitive potential divider or AC voltage divider. Such an arrangement is shown in FIG. 11. The gate of the transistor 400a is connected to the node between capacitors 500 and 502. The gate of the transistor 400b is connected to the node between capacitors 502 and 504. The voltage difference across the capacitors is split by their relative sizes, but if the capacitors are equally sized in their values then the gate voltage for transistor 400b is two-thirds of the voltage at the input node 352 whereas the gate of transistor is held at one third of the input voltage. This has the advantage that the gate voltages are well determined. Thus the transistors are expected to sequentially enter pinch off as the overvoltage increases, and this enables them to voltage share the overvoltage between them. Furthermore, since the transistors are JFETs, the gate leakage current that is normally seen as an undesirable feature of such transistors acts, in normal use (i.e. not under EOS conditions), to hold the gates of transistors 400a and 400b, and the associated capacitor plates, to within the normal operating voltage range of input node 352.

Figure 12:
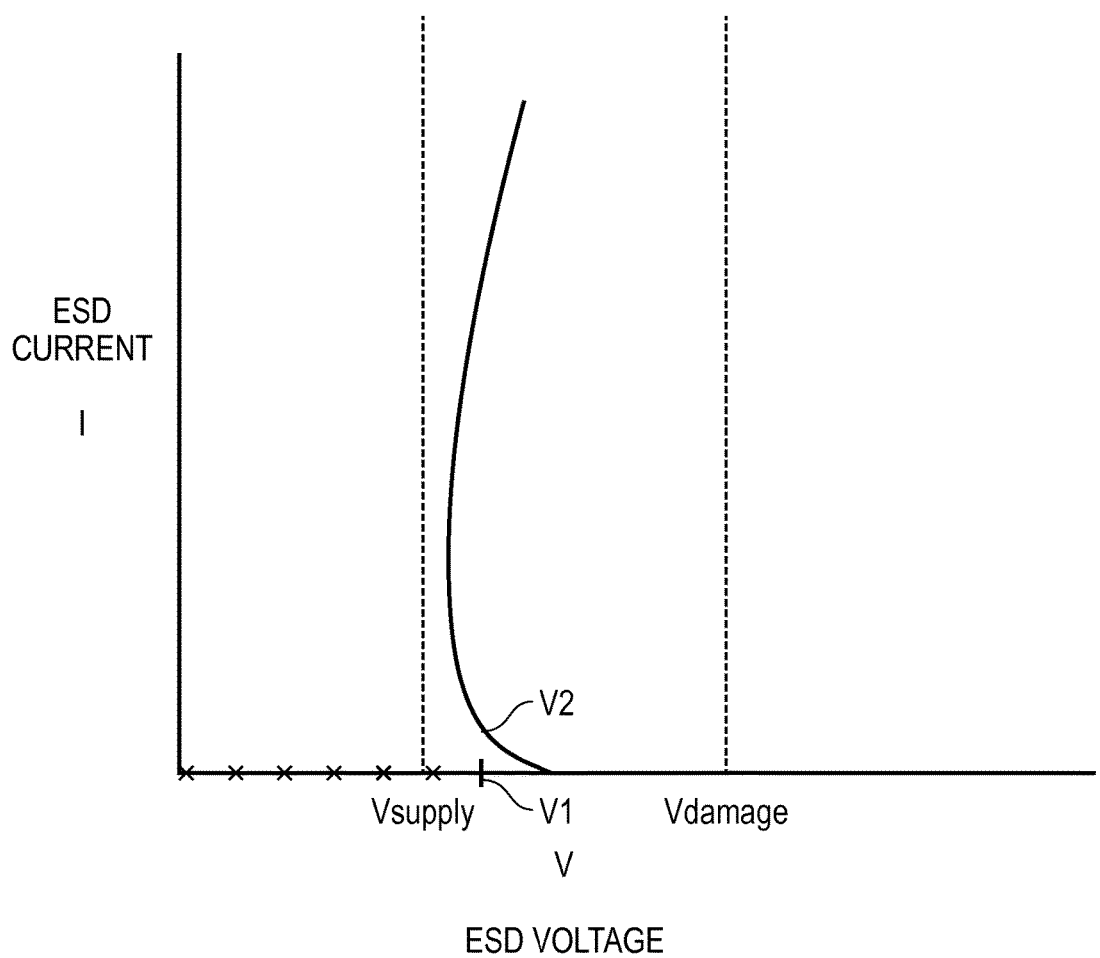
FIG. 12 shows a response of an overvoltage protection circuit in accordance with embodiments in response to an overvoltage event.

FIG. 12 shows, for completeness, a plot of voltage versus current for an electrostatic discharge event where the event occurs an input node which is protected by an overvoltage protection circuit of the type shown in FIG. 8. The voltage at the protected node 354 must not exceed Vdamage at which point device damage occurs. Similarly the protection device must not operate until the voltage at the input node has exceeded the supply voltage Vsupply. Here the protection comes on in two stages. As the input voltage exceeds V1, the JFET moves into pinch off, thereby disconnecting (or at least limiting the voltage at) the node to be protected from the input node. If the voltage continues to rise and reaches the trigger voltage V2, then the lateral transistor 350 switches on an snaps the voltage back to the holding voltage, from then the voltage increases as a function of the ESD current, the voltage substantially being the sum of the holding voltage and the product of the voltage through the transistor and the effective "on" state resistance of the NPN transistor.

Figure 13:
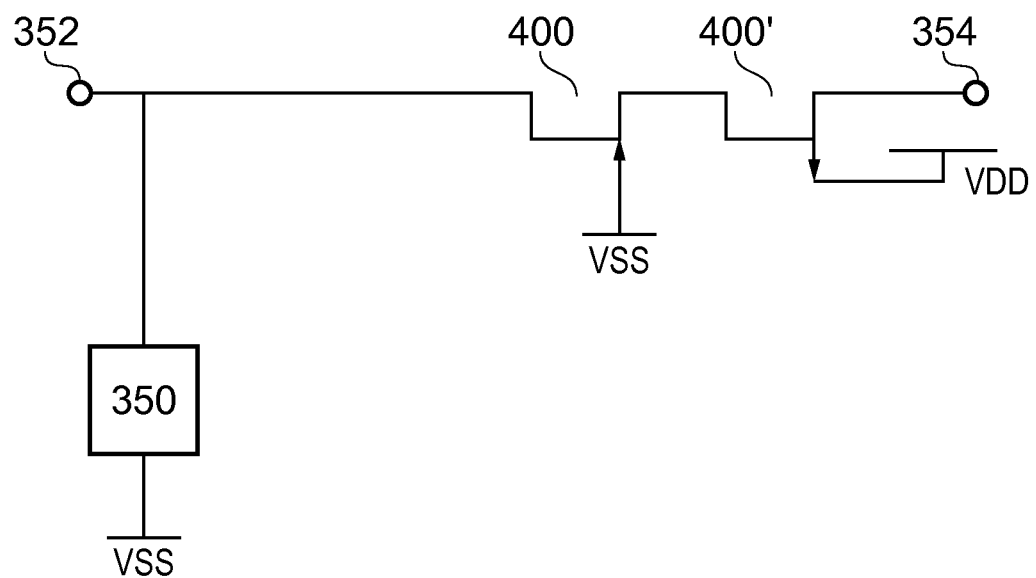
FIG. 13 shows a further embodiment of this disclosure.

If the bidirectional overvoltage protection is desired, then the transistor 400 which here is an N type JFET can be placed in series with a P type JFET 400', as shown in FIG. 13, such that even if the junction diode of one transistor gets biased on, the transistor is in series with another JFET that is switched off. Capacitive coupling of the gate voltage as shown in FIG. 11 is useful in this scenario as the amount of charge available to flow through the forward biased gate-body diode is limited by the capacitor and then further current flow through the gate-body diode is inhibited, thereby saving the device from opening a potentially destructive current flow path.

The lateral NPN transistor responds in several nanoseconds, but the JFET can switch to a high impedance state in less than a picosecond, as will be described with respect to FIGS. 14 to 17, and furthermore does not have to carry the ESD current so can be made small and responsive. As noted earlier, the FET does not have to be a JFET and, for example, the device of FIG. 10 could omit the doping 470 and the via 470a may be made shorter so that it does not contact the channel, so as to form an insulated gate device.

The operation of a series connected JFET based overvoltage protection device has been measured, but also simulated. The simulation enables us to estimate the positions of depletion region boundaries and current flows as they evolve with time following the occurrence of an overvoltage event.

A FET substantially as described with respect to FIG. 10 was used as the basis for a simulation. The only substantive change in the device structure illustrated in FIGS. 14, 15 and 16 compared to FIG. 10 is that the gate implant region 470 is provided slightly to the right (in the figures) of the resurf structure that provides the field plates 482 and 484. The gate implant 470 can be, and advantageously is, connected to the resurf structure. In the simulations such a connection was assumed.

Parts in FIGS. 14, 15 and 16 that are similar or equivalent to parts shown in FIG. 10 are designated with like reference numbers.

The protection circuit can be used with a wide variety of impedances or loads connected to the node to be protected 354. This avoids the need to modify the circuit based on knowledge or assumptions about the impedance connected to node 354. Furthermore the impedance at the node 354 may vary during use of a circuit. The extreme examples of impedance are very low (tending to zero ohm) and very high (in excess of hundreds of mega ohms). Very low impedances may result from the connection of components that actually have a small impedance, such a low value resistors, or may result from the activities of active circuits operating to convert a naturally high impedance node into a low impedance node. An example of this is using an operational amplifier where the input transistors may be MOSFETs having a very high impedance to create a virtual earth, for example as part of a current to voltage converter.

The operation of the protection circuit, and in particular the voltage and current distribution within a transistor acting as the series connected protection device, for loads of 0 ohm and 100 Mohm at the node to be protected were simulated and will now be described. An overvoltage event at a synthesized low impedance node, such as a virtual earth (virtual ground) could still severely damage transistors connected to that node).

Figure 14A:
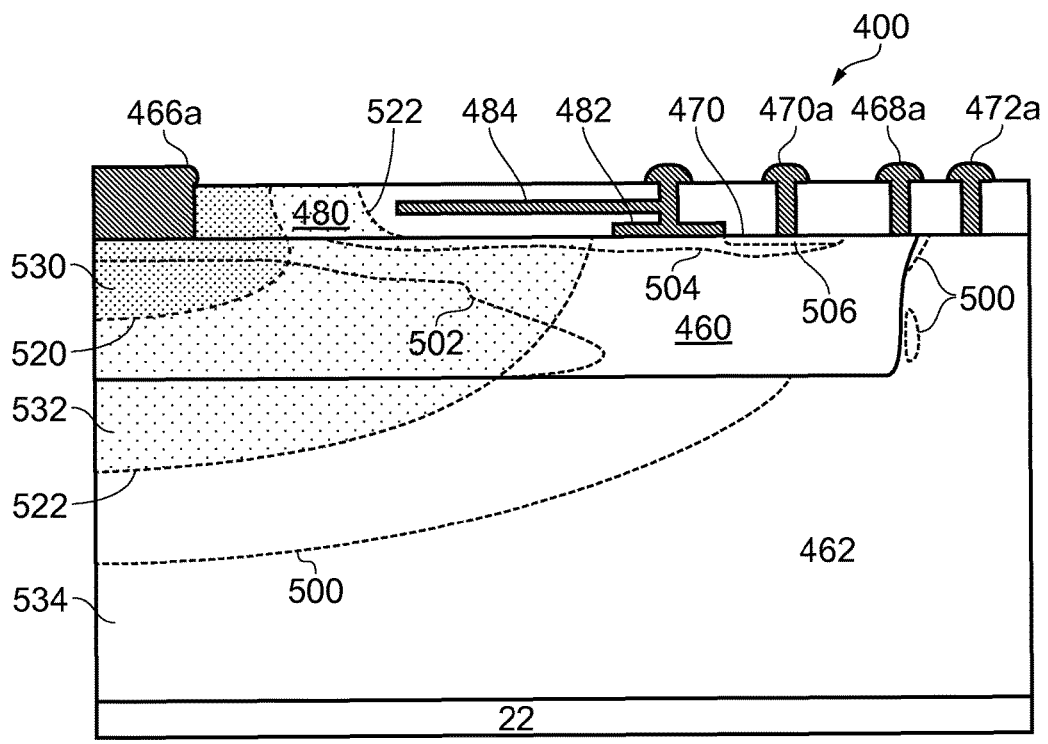
FIGS. 14a and 14b are diagrams showing simulated electric field strength and depletion region boundaries within an overvoltage protection device in accordance with embodiments at 0.6 ns and 100 ns, respectively, after the occurrence of an ESD event.

FIG. 14a shows the distribution of potential within the transistor, as well as the position of depletion regions therein 0.6 ns after the onset of an overvoltage event and where the node to be protected is a low impedance (but could still be damaged by current flow resulting from an overvoltage event.

The depletion regions are indicated by chain lines 500, 502, 504 and 506. Line 500 represents the position of the depletion region boundary within the body material 462. The region 502 is the position of the corresponding depletion region boundary as a result of the channel doping within the bulk material. The line 504 represents the boundary of the depletion region extending into the channel as a result of the potential difference between the field plates 482 and 484 and the voltage in the channel. The line 506 represents the depletion region boundary in the channel that results from the doping for the gate region.

It can be seen that after 0.6 ns the channel still forms a conductive path from the drain contact 466a to the source 468a. This is not surprising as the device had been in its conducting state. The device has a potential difference across it, and this potential difference becomes distributed within the transistor. This is also illustrated in FIG. 14a with lines of equipotential 520 and 522 being used to broadly divide the device into a region 530 where a relatively high elected field gradient exists; region 532 of moderate electric field strength; and a region 534 of low electric field strength. These regions are all assessed in relative terms (and not absolute terms) as the actual field strength depends on the magnitude of the overvoltage event.

Figure 14B:
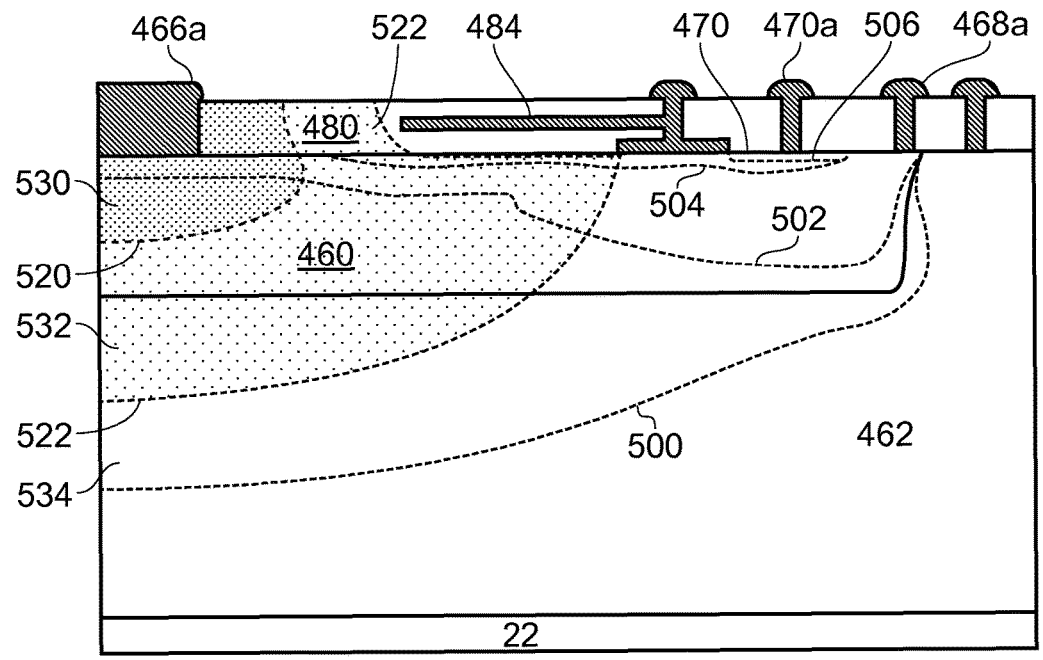

FIG. 14b shows the equivalent information 100 ns after the onset of the overvoltage event. The depletion region's boundaries 500 and 502 have moved but otherwise the device has not changed much. The channel is still conducting, and this will be discussed in greater detail shortly.

Figure 15A:
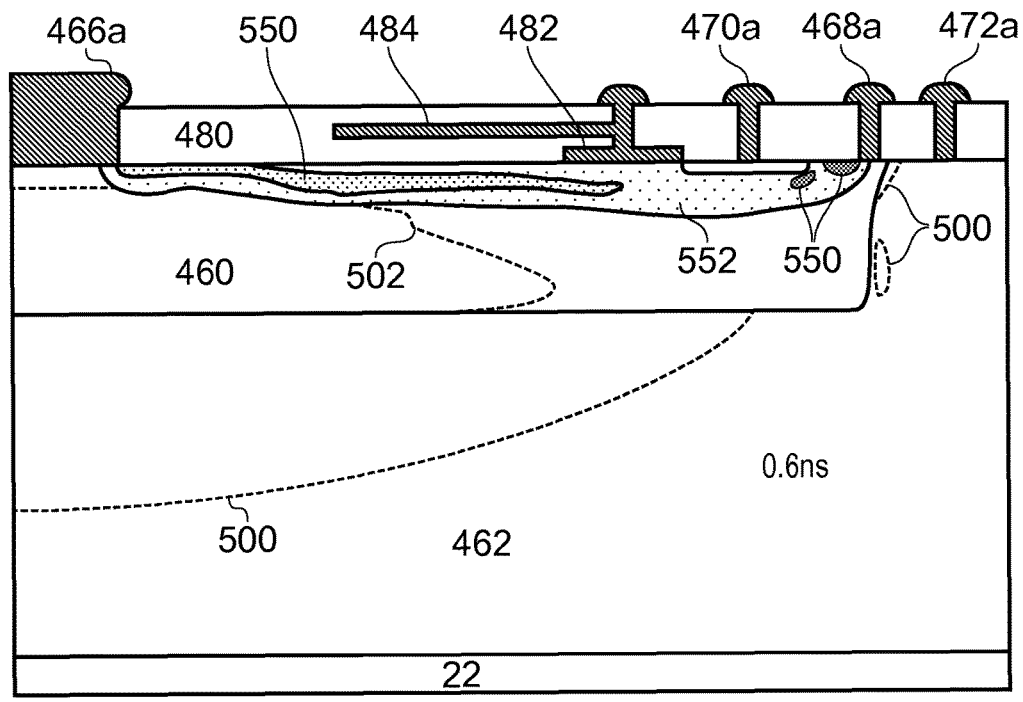
FIGS. 15a and 15b are diagrams showing simulated current flow within the overvoltage protection device of FIGS. 14a and 14b at 0.6 ns and 100 ns, respectively, after the occurrence of an ESD event when the transistor is connected to a low impedance load.
Figure 15B:
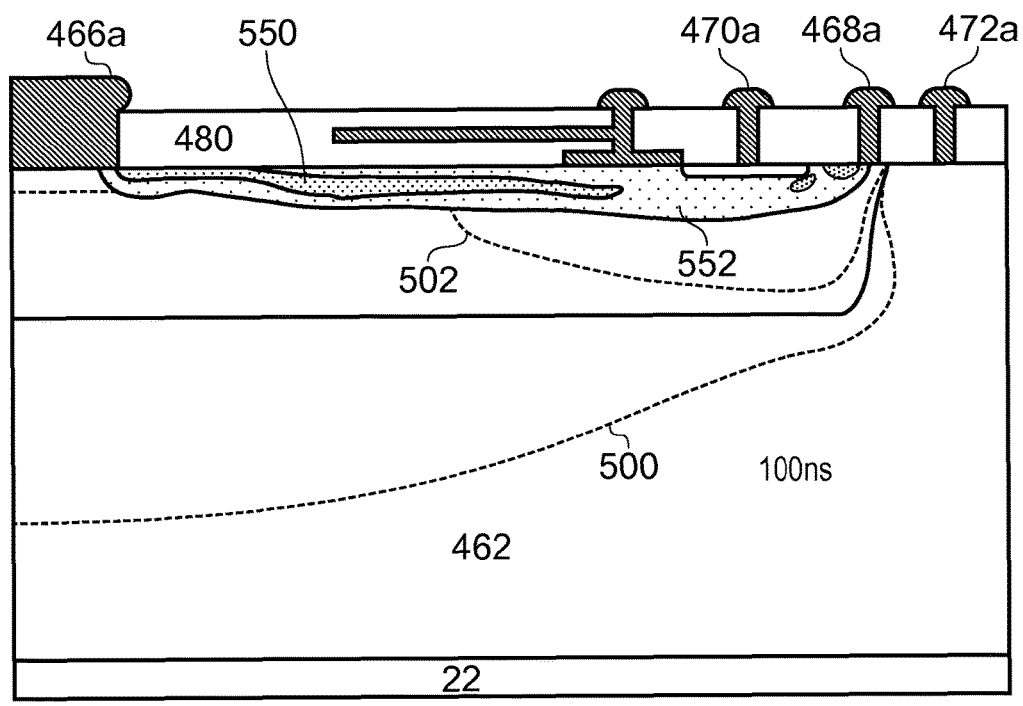

FIGS. 15a and 15b show the transistor again, along with depletion region positions and relative current flow within the device, again at 0.6 ns and 100 ns, respectively, after onset of the overvoltage event. A region of relatively high current density is shown as region 550 within the channel 460, whereas a region of lower current density is shown as region 552.

The channel remains conducting throughout this overvoltage event because the node to be protected exhibits a low impedance. In practice the JFET protection device 400 acts as a voltage controlled resistor such that, to a first approximation, once the threshold voltage of the JFET 400 has been exceeded it holds the current to a nominally constant value. This means that the device is subject to Joule heating as a consequence of the current flow through the transistor and the voltage across the transistor. However where the transistor 400 is provided in combination with the parallel bipolar transistor based protection device 350 providing a current path from the input node 352 to a ground, then the voltage gets clamped.

Figure 16A:
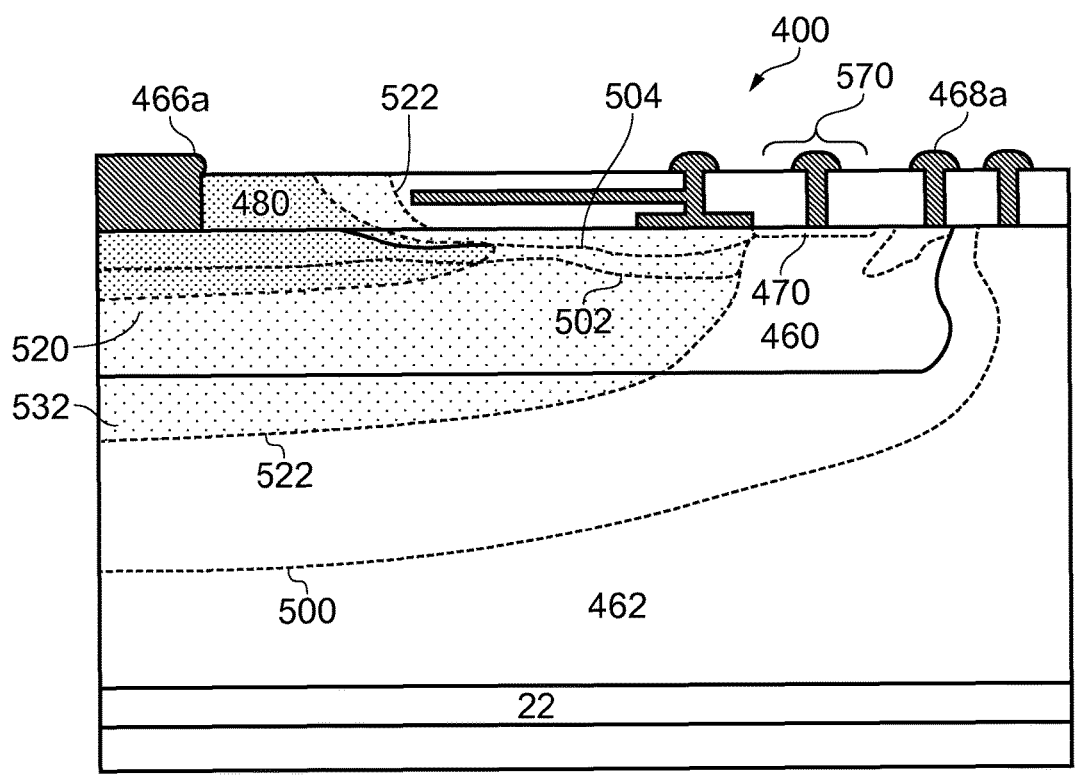
FIG. 16a is a diagram showing electric field strength and depletion region boundaries in the transistor 100 ns after onset of an overvoltage event and when the transistor is connected to a high impedance load.
Figure 16B:
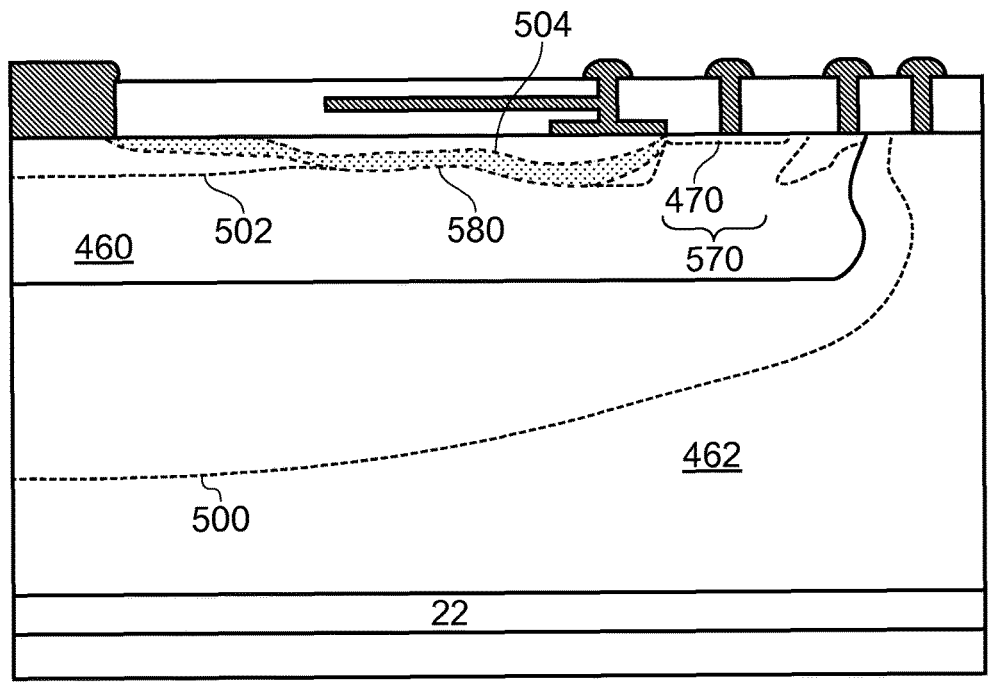
FIG. 16b shows simulated current flow in the transistor 100 ns after onset of the overvoltage event.

As noted earlier it is also possible for the node to be protected 354 to present a high impedance, as might be expected from a MOSFET. FIGS. 16a and 16b show the transistor of FIGS. 14 and 15 after 100 ns when connected to a high impedance node. The equivalent figures for 0.6 ns are very similar to FIGS. 14a and 15a.

The key difference to note in FIGS. 16a and 16b is that the channel has become fully pinched off, as shown by depletion region boundary 502 meeting depletion region boundary 504 at the corner of the gate doping 470. Thus the transistor has reached its maximum impedance. The device is not an ideal device and hence the impedance does not reach infinity. However since the node to be protected 354 is not attached to ideal devices, then the parasitic capacitance and resistance associated with the node to be protected 354 would act to inhibit voltage increase at that node during the duration of the overvoltage event. However, as shown in FIG. 16b the non-ideal behavior of the transistor is exploited to stop the voltage at the protected node 354 from increasing.

FIG. 16b shows the simulated current flow in the transistor 400. Although the transistor is fully pinched off in region 570 beneath the gate, a small leakage current of about 360 nA per micron of gate width at 200V drain voltage flows between the drain and the gate which is grounded. This leakage current which is a function of the non-ideal behavior of the device does take the current from the drain to ground, thereby inhibiting current from flowing from the drain 466a to the source connection 468a. It also follows that the non-ideal leakage through the JFET 400 acts to provide a high impedance discharge path from the node to be protected 352 via to source 468a to the grounded gate 470/470a.

Figure 17:
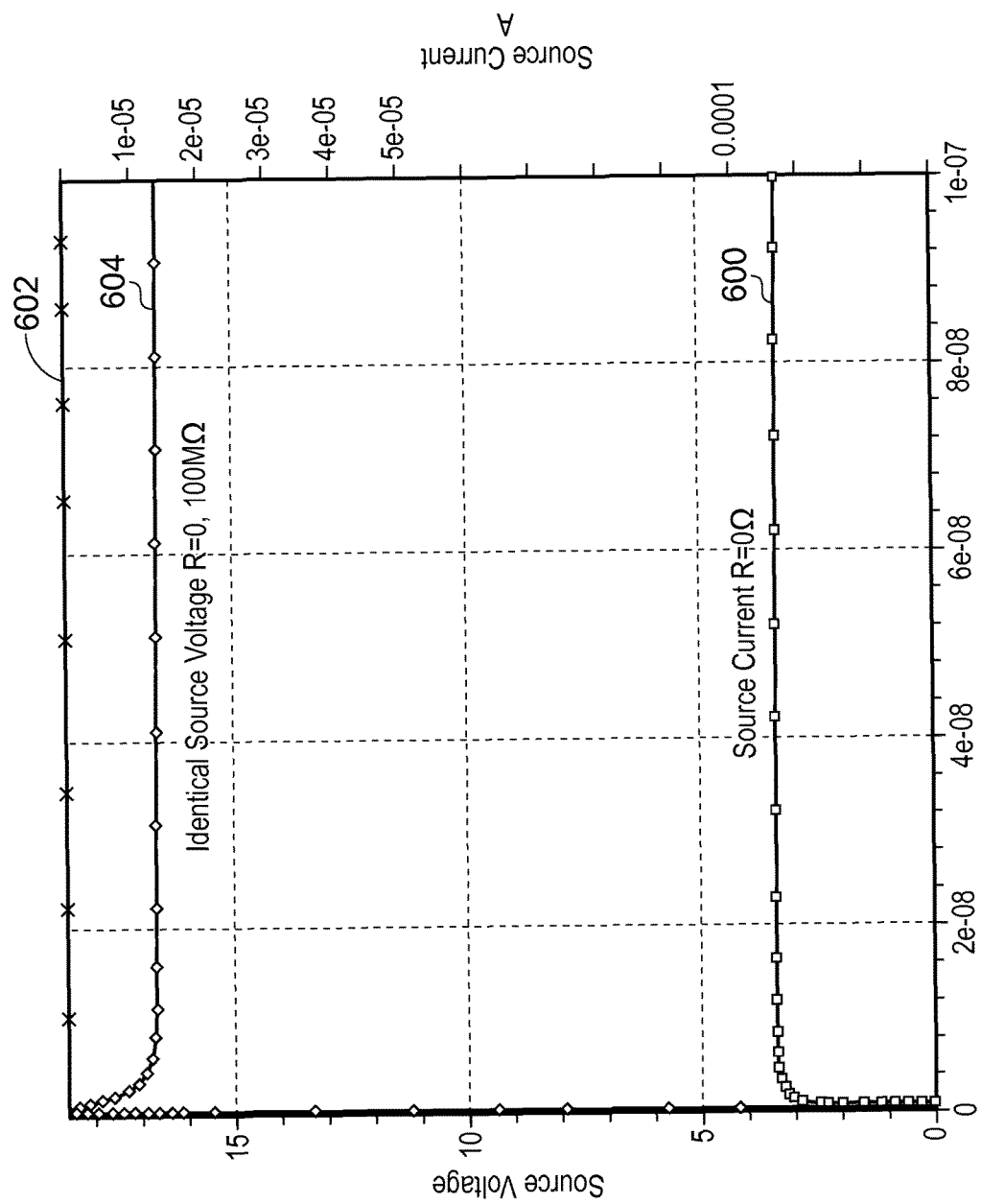
FIG. 17 shows current flow at the source and voltage at the source of the transistor 400 as a function of time for low and high load impedances at the node to be protected.

FIG. 17 shows the voltage at the source of the left hand scale and the source current on the fight hand scale as it evolves from 0 to 100 ns after the onset of an overvoltage event. This is shown for a low, 0 ohm, load and a high value 100 Mohm load.

Considering the current flow, when the protected mode presents a low impedance, the current flow resulting from the ESD event rises from zero to substantially a limit value of around 0.18 mA, and then stays there as the transistor 400 functions as a voltage dependent resistor to hold the current nominally constant, as shown by line 600.

For the high impedance case, with a nominal load of $100 \times 10^6$ ohm, the current through the transistor is very small (around $1.7 \times 10^{-7}$ A), as shown by line 602.

For a simulated overvoltage event of 200V, an initial rise to around 19 to 20V, due to coupling via parasitic capacitance is rapidly followed by the voltage at the source of the transistor 410 becoming close to its pinch-off voltage after about 1 to 2 ns. A steady state was reached by 5 ns or so. This is shown by line 604, which is the same for both a low impedance load and a high (100 Mohm) load at the protected node.

It is thus possible to provide a rapid overvoltage protection without having to incur much of an area overhead on the integrated circuit die.

Devices employing the above described schemes can be implemented into various high performance electronic devices and interface applications operating in harsh electrical environments. Examples of the electronic devices can include, but are not limited to, consumer electronic products, parts of the consumer electronic products, electronic test equipment, high robustness industrial and automotive applications, etc. Examples of the electronic devices can also include circuits of optical networks or other communication networks. The consumer electronic products can include, but are not limited to, an automobile, an engine control unit, a vehicle engine management controller, a transmission controller, a seatbelt controller, an anti-lock brake system controller, a camcorder, a camera, a digital camera, a portable memory chip, a washer, a dryer, a washer/dryer, a copier, a facsimile machine, a scanner, a multi-functional peripheral device, etc. Further, the electronic device can include unfinished products, including those for industrial, medical and automotive applications.

The foregoing description and claims may refer to elements or features as being "connected" or "coupled" together. As used herein, unless expressly stated otherwise, "connected" means that one element/feature is directly or indirectly connected to another element/feature, and not necessarily mechanically. Likewise, unless expressly stated otherwise, "coupled" means that one element/feature is directly or indirectly coupled to another element/feature, and not necessarily mechanically. Thus, although the various schematics shown in the figures depict example arrangements of elements and components, additional intervening elements, devices, features, or components may be present in an actual embodiment (assuming that the functionality of the depicted circuits is not adversely affected).

Although this invention has been described in terms of certain embodiments, other embodiments that are apparent to those of ordinary skill in the art, including embodiments that do not provide all of the features and advantages set forth herein, are also within the scope of this invention. Moreover, the various embodiments described above can be combined to provide further embodiments. In addition, certain features shown in the context of one embodiment can be incorporated into other embodiments as well. Accordingly, the scope of the present invention is defined only by reference to the appended claims.

The claims are presented in single dependency format suitable for filing at the United States Patent and Trademark office. However it should be understood that the feature of any claims can be dependent upon any preceding claim or claims of the same category except where that is clearly technically infeasible. The term "operably connected" or "operatively coupled" should be taken to include direct connection or connection via one or more intermediate components.

What is claimed is:

1. An overvoltage protection device comprising:
   a first device node;
   a node to be protected;
   a first field effect transistor having a first current flow node, a second current flow node, and a gate, wherein the first current flow node is operatively coupled to the first device node, wherein the second current flow node is operatively coupled to the node to be protected, wherein the gate is configured to receive a fixed voltage, wherein the first field effect transistor is conductive when a voltage difference between the gate and either of the first and second current flow nodes is less than a threshold voltage, wherein the first field effect transistor acts to limit or prevent current flow when the voltage difference exceeds the threshold voltage, and wherein the first field effect transistor includes one or more field plates extending from a via coupled to a top gate region; and
   an overvoltage protection cell connected between the first current flow node and a current discharge path, wherein the overvoltage protection cell is normally high impedance.

2. An overvoltage protection device as claimed in claim 1 in which the first field effect transistor is a depletion mode device.

3. An overvoltage protection device as claimed in claim 1 in which the first field effect transistor is a junction field effect transistor.

4. An overvoltage protection device as claimed in claim 1, in which the first current flow node is a drain of the first field effect transistor, and the second current flow node is a source of the first field effect transistor.

5. An overvoltage protection device as claimed in claim 4, in which the source of the first field effect transistor is operatively connected to the node to be protected, and the drain of the first field effect transistor is operatively connected to the first device node.

6. An overvoltage protection device as claimed in claim 1 wherein the gate of the first field effect transistor is connected to ground or to Vss.

7. An overvoltage protection device as claimed in claim 6 wherein the first field effect transistor is an N type device.

8. An overvoltage protection device as claimed in claim 1 wherein the gate of the first field effect transistor is connected to a positive supply or Vdd and the transistor is a P type device.

9. An overvoltage protection device as claimed in claim 1 further comprising a second field effect transistor operatively coupled between the first current flow node of the first field effect transistor and the first device node, and wherein the gate of the second field effect transistor is coupled to the first current flow node of the first field effect transistor.

10. An overvoltage protection device as claimed in claim 1 further comprising a plurality of field effect transistors coupled in series between the node to be protected and the first device node, and a potential divider configured to provide respective potentials to gates of at least one of the plurality of field effect transistors, wherein the plurality of field effect transistors comprises the first field effect transistor.

11. An overvoltage protection device as claimed in claim 1 further comprising a plurality of field effect transistors connected in series between the node to be protected and the input, wherein the plurality of field effect transistors comprises at least one N type field effect transistor and at least one P type field effect transistor, and wherein the plurality of field effect transistors comprises the first field effect transistor.

12. An overvoltage protection device as claimed in claim 1, wherein the overvoltage protection cell is connected between the first current flow node and the current discharge path, and wherein the overvoltage protection cell is also connected between the first device node and the current discharge path.

13. An overvoltage protection device as claimed in claim 1, wherein the first field effect transistor is configured to pinch off at a first voltage, and wherein the overvoltage protection cell is configured to trigger at a second voltage that is greater than the first voltage.

14. A circuit or integrated circuit including an overvoltage protection device as claimed in claim 1.

15. A method of protecting a node to be protected from an electrostatic discharge (ESD) overvoltage event, the method comprising:
  placing a voltage controlled resistance in a signal path to the node to be protected, wherein the voltage controlled resistance comprises a transistor including one or more field plates coupled to a via that extends from a top gate region of the transistor to cover a portion of a channel region of the transistor;
  coupling a gate of the voltage controlled resistance to a fixed voltage;
  increasing the resistance of the voltage controlled resistance in response to the voltage in the signal path exceeding a first threshold voltage;
  placing a voltage controlled conduction path between an input node and a supply rail so as to open up a discharge path for current from the input node to the supply rail when the voltage thereon exceeds a second threshold voltage greater than the first threshold voltage; and
  wherein the voltage controlled resistance is operatively coupled between the input node and the node to be protected.

16. A method as claimed in claim 15 in which the voltage controlled resistance is a JFET, and the JFET is responsive to the ESD overvoltage event to limit current flow in less than 10 nanoseconds.

17. A method as claimed in claim 15 in which the voltage controlled resistance is a JFET, and the JFET is responsive to the ESD overvoltage event to limit current flow in less than 3 nanoseconds.

18. An electronic system comprising:
  one or more protection junction field effect transistors (JFETs) connected between an input node and a node to be protected, wherein the one or more protection JFETs provide overvoltage blocking between the input node and the node to be protected in response to an electrostatic discharge (ESD) event at the input node, and wherein at least a first JFET of the one or more JFETs comprises:
    a gate configured to receive a fixed voltage;
    one or more field plates covering a portion of a channel region between a drain region and the gate, the one or more field plates configured to modify an electric field gradient at a surface of the channel region by different amounts at different places; and
  a protection bipolar device connected between the input node and a discharge node, wherein the protection bipolar device transitions from a high impedance state to a low impedance state in response to the ESD event at the input node.

19. The electronic system of claim 18, wherein the channel region and the drain region have a first doping type, wherein the one or more protection JFETs further comprises:
  a top gate region of a second doping type in the channel region; and
  a via connected to the top gate region, the one or more field plates extending from the via.

20. The electronic system of claim 18, wherein the one or more field plates include at least a first field plate of a first length and a second field plate of a second length that is different from the first length.

* * * * *